US006310372B1

(12) United States Patent
Katayama et al.

(10) Patent No.: US 6,310,372 B1
(45) Date of Patent: Oct. 30, 2001

(54) SUBSTRATE FOR ELECTRO-OPTICAL APPARATUS, ELECTRO-OPTICAL APPARATUS, METHOD FOR DRIVING ELECTRO-OPTICAL APPARATUS, ELECTRONIC DEVICE AND PROJECTION DISPLAY DEVICE

(75) Inventors: Shigenori Katayama; Masahiro Yasukawa, both of Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/532,017

(22) Filed: Mar. 21, 2000

Related U.S. Application Data

(62) Division of application No. 09/219,708, filed on Dec. 23, 1998, now Pat. No. 6,066,860.

(30) Foreign Application Priority Data

Dec. 25, 1997 (JP) ..................................... 9-358622

(51) Int. Cl.⁷ ........................... H01L 27/01; H01L 27/12; H01L 31/0392
(52) U.S. Cl. ........................ 257/291; 257/350; 250/332; 250/370.08; 250/370.14
(58) Field of Search ................................ 257/59, 71, 72, 257/296, 350, 291, 292; 25/332, 370.08, 370.14

(56) References Cited

U.S. PATENT DOCUMENTS

| 5,644,147 | | 7/1997 | Yamazaki et al. . | |
|---|---|---|---|---|
| 5,780,858 | * | 7/1998 | Waechter et al. | 250/370.09 |
| 5,990,629 | | 11/1999 | Yamada et al. . | |
| 6,169,286 | * | 1/2001 | Singh | 250/370.08 |

* cited by examiner

*Primary Examiner*—Ngân V. Ngô
(74) *Attorney, Agent, or Firm*—Oliff & Berridge, PLC

(57) ABSTRACT

In a conventional MOS semiconductor device of a thin film SOI structure, excessive carriers accumulated in the channel region cause some problems, such as a decreased drain breakdown voltage and formation of kink in the current-voltage relationship, resulting in malfunction. Accordingly, drainage of the excessive carriers accumulated in the semiconductor layer functioning as a channel region of the thin film transistor on a substrate for electro-optical apparatuses is achieved.

3 Claims, 17 Drawing Sheets

SUBSTRATE FOR ELECTRO-OPTICAL APPARATUS, ELECTRO-OPTICAL APPARATUS, METHOD FOR DRIVING ELECTRO-OPTICAL APPARATUS, ELECTRONIC DEVICE AND PROJECTION DISPLAY DEVICE

This is a Division of application Ser. No. 09/219,708 filed Dec. 23, 1998, now U.S. Pat. No. 6,066,860.

BACKGROUND OF THE INVENTION

1. Field of the Invention

The present invention relates to a substrate for an electro-optical apparatus, an electro-optical apparatus, a method for driving the electro-optical apparatus, an electronic device, and a projection display apparatus.

2. Description of the Related Art

Semiconductor technologies for forming single-crystal silicon thin films on supporting substrates and forming semiconductor devices on the silicon thin films are called silicon-on-insulator (SOI) technologies, and have been widely studied since they have advantages, such as high-speed response of transistor elements formed of the silicon thin films, low consumption of electrical power, and high integration.

In general, growth of polycrystalline silicon on insulating layers is easy whereas growth of single-crystal silicon is difficult. Use of SOI technologies, such as separation-by-implanted oxygen (SIMOX) methods and adhering methods, therefor, has been studied. In the SIMOX method, oxygen ions are implanted into a single-crystal silicon substrate to form an insulating layer composed of a silicon oxide film in the interior of the single-crystal silicon substrate while leaving the single-crystal silicon layer at the surface. In the adhering method, thermal oxide films are formed on the one surface or the two surfaces of two single-crystal substrates, these substrates are adhered to each other, and then one of the single-crystal substrates is thinned by shaving to form a device layer. In a disclosed application of the adhering method, hydrogen ions are implanted into a single-crystal silicon substrate, this substrate is adhered to a supporting substrate, and then the thin film silicon layer is separated from the hydrogen-doped region of the single-crystal silicon substrate by thermal treatment (U.S. Pat. No. 5,374,564). In another disclosed application, a single-crystal silicon layer is epitaxially deposited onto a silicon substrate with a porous surface, the silicon substrate is adhered to a supporting substrate and detached, and then the porous silicon layer is etched to form an epitaxial single-crystal silicon thin film on the supporting substrate (Japanese Laid-Open Application No. 4-346418).

MOS semiconductor devices having such a thin film SOI structure have parasitic capacitance smaller than that of general bulk-type MOS semiconductor devices. Problems in bulk-type MOS semiconductor devices, that is, junction capacitance between source/drain regions and a substrate and wiring capacitance formed between the substrate and wirings formed on the substrate, are significantly moderated in the MOS semiconductor device having the SOI structure as compared with the bulk-type MOS semiconductor devices, since at least the surface of the substrate is composed of an insulating material. Furthermore, the MOS semiconductor device having the thin film SOI structure does not form a current path in a deep layer at the substrate side which is problematic in the bulk-type MOS semiconductor device, and thus is resistive to a so-called punch-through phenomenon.

Substrates provided with such a MOS semiconductor device having the SOI structure (SOI substrates), as well as substrates provided with conventional bulk-type MOS semiconductor devices (bulk-type semiconductor substrates) have been used in production of various devices, and have an advantage, that is, possible use of various materials as supporting substrates, unlike the conventional bulk-type semiconductor devices. Usable supporting substrates include transparent quartz glass and general glass substrates in addition to general single-crystal silicon substrates. As a result, for example, formation of a single-crystal silicon thin film on a transparent substrate enables formation of high-performance transistors in optically transmittable devices, for example, a transmissive liquid crystal display device using single-crystal silicon having high crystallinity.

Although the MOS semiconductor device having the thin film SOI structure has many advantages as described above, it has a problem, that is, a substrate floating effect. The substrate floating effect means accumulation of excessive carriers in channel regions without emission because of the insulating substrate surface provided with substrate transistors. When the channel in a thin film transistor having SOI structures is composed of single-crystal silicon layers having high electron transportability, potential difference generated between a source and a drain will readily result in accumulation of carriers (charges) in the channel regardless of an OFF state of the thin film transistor. When the transistor is in an ON state, an excessive current will readily form. When such carriers (charges) are accumulated or flow in the channel of the thin film transistor, the excessive carrier (charges) causes various problems, such as a decrease in withstand voltage of the transistor element and formation of kink in the current-voltage relationship of the transistor element

SUMMARY OF THE INVENTION

It is an object of the present invention as a countermeasure of the above-described problems to provide a substrate for electro-optical apparatuses in which reliability of transistors formed on an insulating material is improved, an electro-optical apparatus using the same, a method for driving the electro-optical apparatus, and an electronic device and a projection display apparatus using the electro-optical apparatus.

A substrate for electro-optical apparatus in accordance with the present invention, for solving the above-mentioned problems, consists of a transistor provided to each of a matrix of pixel regions formed on the substrate, wherein a semiconductor layer functioning as (constituting) a channel region of the transistor is formed on the substrate, and the semiconductor layer functioning as a channel region is electrically connected to another scanning signal line which is different from a scanning signal line electrically connected to the gate electrode of the transistor. In accordance with the present invention, excessive carriers accumulated in the channel region are drained to another scanning signal line to suppress the substrate floating effect, resulting in an improvement in the withstand voltage of the transistor and suppression of kink in the current-voltage relationship. Thus, use of the substrate for electro-optical apparatus permits production of devices having superior transistor characteristics.

It is preferable in the present invention that another different scanning signal line lies at the preceding side of the scanning signal line electrically connected to the transistor. When the channel region of the transistor is connected to the another scanning line at the preceding side of the scanning signal line electrically connected to the transistor, a selection period for applying a selection potential is followed by a non-selection period which is longer in general than the selection period, hence a stable non-selection potential applied to the preceding scanning signal line extracts excessive carriers in the channel region (the carriers in the present invention have the same meaning as charges). It is preferable that the preceding scanning signal line be that immediately precedent to the signal line, but it may be precedent to the scanning signal line by two lines or more.

It is preferable in the present invention that the transistor is an N-channel type transistor and a potential which is equal to or lower than that of an image signal supplied to the transistor be applied to the preceding scanning signal line. In the N-channel type transistor, electrons (negative charges) are accumulated in the channel region. The scanning signal line connected to the channel must be at a lower potential to drain the accumulated excess carriers. Since a current based on the image signal flows in the channel, the carriers can be effectively drained by a potential which is equal to or lower than that of the image signal is applied to the scanning signal line connected to the channel.

It is preferable in the present invention that the transistor is a P-channel type transistor and a potential which is equal to or higher than that of the image signal supplied to the transistor be applied to the preceding scanning signal line. In the P-channel type transistor, positive holes (positive charges) are accumulated in the channel region. The scanning signal line connected to the channel must be at a lower potential to drain the accumulated excess carriers. Since a current based on the image signal flows in the channel, the carriers can be effectively drained by a potential which is equal to or higher than that of the image signal is applied to the scanning signal line connected to the channel.

It is preferable in the present invention that the semiconductor layer in the channel region of the transistor be a conductive type which is different from that of a semiconductor layer functioning as the source/drain region in the transistor. When an ionic impurity which is different from that in the source/drain region is doped into the channel, the threshold voltage of the transistor element is controllable and charges accumulated in the channel are readily drained due to its conductive characteristics It is preferable in the present invention that the semiconductor layer in the channel region of the transistor is doped with an impurity having a lower concentration than that in the semiconductor layer functioning as the source/drain region. It is preferable that the impurity concentration in the channel be low to prevent an increase in the leakage current of the transistor in a non-conductive state.

It is preferable in the present invention that the semiconductor layer functioning as the channel region has an extended section and that the extended section is electrically connected to another scanning signal line which is different one from the scanning signal line electrically connected to the gate electrode of the transistor having the channel region. The semiconductor layer in the channel region is extended without providing a contact hole for draining just below or just above the channel region so that the excessive carriers are drained from the channel region through the another scanning signal line; hence the thickness of the channel does not vary and thus the switching operation of the transistor is not affected.

It is preferable in the present invention that the semiconductor layer in the channel region and the semiconductor layer in the extended section be a different conductive type from that of the semiconductor layer functioning as the source/drain region. When the channel and the extended section are the same conductive-type semiconductor layer formed by simultaneously doping the same impurity, excessive carriers can be readily drained from the channel through the extended section.

It is preferable in the present invention that the semiconductor layer in the extended section is doped with an impurity with a concentration which is higher than that in the channel region. Since the resistance of the extended section is reduced, charges readily move from the channel region of the transistor via the extended section and are readily drained.

It is preferable in the present invention that the transistor is an N-channel type transistor and a non-selection potential equal to or lower than that of the image signal supplied to the transistor is applied to the another scanning signal line. In the N-channel type transistor, electrons (negative charges) are accumulated in the channel region. The scanning signal line connected to the channel must be at a low potential in order to drain the accumulated excessive carriers. Since a current based on the image signal flows in the channel, a potential equal to or lower than that of the image signal must be applied to the scanning signal line connected to the channel.

It is preferable in the present invention that the transistor is a P-channel type transistor and a non-selection potential equal to or higher than that of the image signal supplied to the transistor is applied to the another scanning signal line. In the P-channel type transistor, positive holes (positive charges) are accumulated in the channel region. The scanning signal line connected to the channel must be at a high potential in order to drain the accumulated excess carriers. Since a current based on the image signal flows in the channel, a potential equal to or higher than that of the image signal must be applied to the scanning signal line connected to the channel.

Since the channel region of the transistor is composed of a single-crystal silicon layer in the present invention, the transistor has high charge transportability and the channel readily accumulates charges when the conductive state changes to the nonconductive state. The configuration for draining them in the present invention can improve reliability of the transistor. Accordingly, it is preferable that charges accumulated in the channel region of the transistor be drained through the another scanning signal line.

A substrate for electro-optical apparatus in accordance with the present invention, for solving the above-mentioned problems, consists of an N-channel type transistor provided to each of a matrix of pixel regions formed on the substrate, wherein a semiconductor layer functioning as a channel region of the N-channel type transistor is formed on the substrate, and the semiconductor layer functioning as the channel region is electrically connected to a conductive layer in which a potential equal to or lower than that of an image signal supplied to the transistor is applied. In accordance with the present invention, excessive carriers accumulated in the channel region are drained through a scanning signal line to suppress the substrate floating effect, resulting in an improvement in the withstand voltage of the transistor and suppression of kink in the current-voltage relationship. Thus, use of the substrate for electro-optical apparatuses permits production of devices having superior transistor characteristics. The N-channel type transistor accumulates electrons (negative charges) in the channel region. The scanning signal line connected to the channel must be at a low potential in order to drain the accumulated excess carriers. Since a current based on the image signal flows in the channel, the carriers can be effectively drained by applying a potential which is equal to or lower than that of the image signal applied to the scanning signal line connected to the channel. In the present invention, when the conducive layer is another scanning signal line lying precedent to the scanning signal line electrically connected to the gate electrode of the transistor having the channel region, or is an electrode of a storage capacitor in which the other electrode is electrically connected to the transistor having the channel region, it is not necessary to provide a special wiring for draining the carriers in the pixel region.

It is preferable in the present invention that the semiconductor layer in the channel region and the semiconductor layer, which is the extended section of the former semiconductor layer for electrical connection to the former conductive semiconductor layer, are doped with a p-type impurity. Thereby, in the N-channel type transistor, electrons (negative charges) are accumulated in the channel region; hence it is preferable that the semiconductor layer be of a p-type to drain the carriers by increasing carrier transportability.

A substrate for electro-optical apparatus in accordance with the present invention, for solving the above-mentioned problems, consists of a P-channel type transistor provided to each of a matrix of pixel regions formed on the substrate, wherein a semiconductor layer functioning as a channel region of the P-channel type transistor is formed on the substrate, and the semiconductor layer functioning as the channel region is electrically connected to a conductive layer in which a potential equal to or higher than that of an image signal supplied to the transistor is applied. In accordance with the present invention, excessive carriers accumulated in the channel region are drained through a scanning signal line to suppress the substrate floating effect, resulting in an improvement in the withstand voltage of the transistor and suppression of kink in the current-voltage relationship. Thus, use of the substrate for electro-optical apparatuses of the present invention permits production of devices having superior transistor characteristics. The P-channel type transistor accumulates electrons (positive charges) in the channel region. The scanning signal line connected to the channel must be at a high potential in order to drain the accumulated excessive carriers. Since a current based on the image signal flows in the channel, the carriers can be effectively drained by applying a potential which is equal to or higher than that of the image signal to the scanning signal line connected to the channel.

In the present invention, when the conductive layer is another scanning signal line lying precedent to the scanning signal line electrically connected to the gate electrode of the transistor having the channel region or is an electrode of a storage capacitor in which the other electrode is electrically connected to the transistor having the channel region, it is not necessary to provide a special wiring for draining the carriers in the pixel region.

It is preferable in the present invention that the semiconductor layer in the channel region and the semiconductor layer in the extended section electrically connected to the former semiconductor layer are doped with an n-type impurity. In the P-channel type transistor, positive holes (negative charges) are accumulated in the channel region; hence it is preferable that the semiconductor layer be of an n type so that the transportability is increased and carriers are drained easily.

A substrate for electro-optical apparatus in accordance with the present invention, for solving the above-mentioned problems, consists of a transistor and a capacitor provided to each of a matrix of pixel regions formed on a substrate, one of the source and drain of the transistor being electrically connected to an electrode of the capacitor wherein a semiconductor layer functioning as a channel region of the transistor is formed on the substrate, and the semiconductor layer functioning as a channel region is electrically connected to the other electrode of the capacitor. In accordance with the present invention, excessive carriers accumulated in the channel region are drained through the electrode of the storage capacitor to suppress the substrate floating effect, resulting in an improvement in the withstand voltage of the transistor and suppression of kink in the current-voltage relationship. Thus, use of the substrate for electro-optical apparatuses in accordance with the present invention permits production of devices having superior transistor characteristics.

It is preferable in the present invention that the transistor is an N-channel type transistor and a potential which is equal to or lower than that of the image signal supplied to the transistor is applied to the other electrode of the storage capacitor. In the N-channel type transistor, electrons (negative charges) are accumulated in the channel region. The electrode of the storage capacitor connected to the channel must be at a lower potential to drain the accumulated excessive carriers. Since a current based on the image signal flows in the channel, the carriers can be effectively drained by applying a potential which is equal to or lower than that of the image signal to the electrode of the storage capacitor connected to the channel.

It is preferable in the present invention that the transistor is a P-channel type transistor and a potential which is equal to or higher than that of the image signal supplied to the transistor is applied to the other electrode of the storage capacitor. In the P-channel type transistor, positive holes (positive charges) are accumulated in the channel region. The electrode of the storage capacitor connected to the channel must be at a higher potential to drain the accumulated excess carriers. Since a current based on the image signal flows in the channel, the carriers can be effectively drained by applying a potential which is equal to or higher than that of the image signal to the electrode of the storage capacitor connected to the channel.

It is preferable in the present invention that the semiconductor layer in the channel region of the transistor be a conductive type which is different from that of a semiconductor layer functioning as the source/drain region in the transistor. When an ionic impurity which is different from that in the source/drain region is doped into the channel, the threshold voltage of the transistor element is controllable and charges accumulated in the channel are readily drained due to its conductive characteristics.

It is preferable in the present invention that the semiconductor layer in the channel region of the transistor is doped with an impurity having a lower concentration than that in the semiconductor layer functioning as the source/drain region. It is preferable that the impurity concentration in the channel is low to prevent an increase in the leakage current of the transistor in a non-conductive state.

It is preferable in the present invention that the semiconductor layer functioning as the channel region has an extended section and that the extended section is electrically connected to the other electrode of the storage capacitor. The semiconductor layer in the channel region is extended without providing a contact hole for draining just below or just above the channel region so that the excessive carriers are drained from the channel region through the electrode of the storage capacitor; hence the thickness of the channel does not vary and thus the switching operation of the transistor is not affected.

It is preferable in the present invention that the semiconductor layer in the channel region and the semiconductor layer at the extended section be a different conductive type from that of the semiconductor layer functioning as the source/drain region. When the channel and the extended section are the same conductive-type semiconductor layer formed by simultaneously doping the same conductive type impurity, excessive carriers can be readily drained from the channel through the extended section.

It is preferable in the present invention that the semiconductor layer in the channel region is doped with an impurity having a lower concentration than that of the semiconductor layer functioning as the source/drain region. It is preferable that the impurity concentration in the channel is low to prevent an increase in the leakage current of the transistor in a non-conductive state.

It preferable in the present invention that the semiconductor layer functioning as a channel region has an extended section, which is electrically connected to the other electrode of the storage capacitor. The thickness of the layer of the channel region does not change, because the excessive carriers are drained from the channel region through the electrode of the storage capacitor by not forming contact holes for extracting just over or just under of the channel region, but extending the semiconductor layer of the channel region. Thus, no influence is given to the switching operation of the transistor.

It preferable in the present invention that the conductive type of the semiconductor layer of the channel region and the semiconductor layer of the extended section thereof is different from that of the semiconductor layer functioning as the source/drain region of the transistor. If the channel and the extended section are the same conductive type semiconductor layers, which are formed by simultaneously doping the same conductive type impurities, excessive carriers of the channel region can be readily drained.

It is preferable in the present invention that the semiconductor layer at the extended section is doped with an impurity with a concentration which is higher than that in the channel region. Since the resistance of the extended section is reduced, charges readily move from the channel region of the transistor via the extended section and are readily drained.

Since the channel region of the transistor is composed of a single-crystal silicon layer in the present invention, the transistor has high charge transportability and the channel readily accumulates charges at the time that there is a potential difference between the source and the drain, even when the transistor is in an OFF state. Further, when the transistor is in an ON state, excessive current is liable to flow. These carriers cause undesired drain breakage of the transistor. Thus, the configuration for draining excessive charges in the present invention can improve reliability of the transistor. Accordingly, it is preferable that charges accumulated in the channel region of the transistor be drained through the other electrode of the storage capacitor.

It is preferable that the channel region is electrically connected to a wiring branched from the another scanning signal line or a wiring connected to the another scanning signal line. Long extension of the semiconductor layer functioning as the channel region up to the scanning signal line of the pixel line causes an increase in resistance and thus difficult drainage of the excessive carriers in the channel; however, generally, the wiring of the conductive layer having lower resistivity than that of the semiconductor layer is extended for connection Thus, the total wiring resistance between the channel and the scanning signal line decreases, resulting in ready drainage of the excessive carriers. An increase in the semiconductor layer area in the channel region causes an increase in capacitance, resulting in deterioration of switching characteristics of the transistor. As in the present invention, however, the wiring branched from or connected to the scanning signal line is extended; hence the total wiring resistance between the channel and the scanning signal line decreases to cause ready drainage of the carriers without deterioration of the transistor characteristics. In particular, since extension by branching from the scanning signal line does not require provision of additional wirings, the aperture percentage does not decrease. When the wiring connected to the scanning signal line is connected to the channel region, extension can be performed using another wiring layer so as to overlap with the scanning signal line; hence the overlapping wiring layers can be provided without a decreased aperture percentage.

It is preferable in the present invention that the wiring branched from the another scanning signal line or the wiring connected to the different scanning line is arranged along the periphery of a pixel region. The wiring is provided along the end of the pixel electrode so as not to decrease the aperture percentage. Thus, the aperture percentage of the transparent liquid crystal panel is not decreased.

It is preferable in the present invention that the wiring branched from the another scanning signal line or the wiring connected to the different scanning line is arranged along the image signal line crossing the scanning signal line and also arranged along the scanning signal line provided in the vicinity of the channel region of the transistor. Since the channel of the transistor is distant from the scanning signal line connected to this, the wiring is arranged along the image signal line so as not to decrease the aperture percentage. When the wiring is formed of a conductive layer which is different from that of the image signal line, the wiring may be arranged so as to overlap with the image signal line separated by an insulating interlayer. The wiring is arranged along the scanning signal line so as not to decrease the aperture ratio. When the wiring is formed of a conductive layer which is different from that of the scanning signal line, the wiring may be arranged so as to overlap with the scanning signal line separated by an insulating interlayer.

It is preferable in the present invention that the wiring branched from the another scanning signal line or the wiring connected to the different scanning line, and the image signal line and the scanning line which are adjacent to the aforementioned wirings are arranged so as to overlap in a planar manner with a light shielding layer formed on the substrate below the semiconductor layer. When the wiring and the image signal line are juxtaposed with each other (including overlapping), the light shielding layer formed on the substrate can shield these two lines. When the wiring and the scanning signal line are juxtaposed with each other (including overlapping), the light shielding layer formed on the substrate can shield these two lines. Since the light shielding layer also continuously shields the channel region from the wiring and the scanning signal line, the semiconductor layer is not affected by light.

It is preferable in the present invention that the semiconductor layers in the channel region and the extended section are arranged so as to overlap in a planar manner with a light shielding layer formed on the substrate below the semiconductor layer. Since the light shielding layer can shield the channel region and the extended section, the incident light does not inhibit drainage of excessive carriers.

It is preferable in the present invention that the substrate is composed of a transparent substrate, and particularly be formed of glass. In this case, the pixel electrode connected to the transistor may be a transparent electrode or a reflective electrode.

It is preferable in the present invention that the substrate is composed of a semiconductor substrate, and particularly be formed of single-crystal silicon. In this case, the pixel electrode connected to the transistor may be a reflective electrode.

As described above, not only a high transmissive glass substrate but also a semiconductor substrate may be employed as a substrate for electro-optical apparatuses in accordance with the present invention. The pixel electrode may also be composed of a transparent electrode or a reflective electrode. Thus, the substrate for electro-optical apparatuses in accordance with the present invention can be used for both transmission and reflection electro-optical apparatuses.

It is preferable in the present invention that a planarized insulating film is formed above the transistor and the pixel electrode be formed on the planarized insulating film. It is preferable that an insulating film having a plurality of layers be formed above the transistor, the upper layer among a plurality of the insulating layers be planarized, and the pixel electrode be formed on the planarized upper insulating layer. Since the pixel electrode is formed on the planarized insulating film, the pixel electrode facing the liquid crystal layer is also planarized. Thus, irregular orientation after rubbing orientation of the inner surface of the substrate for electro-optical apparatuses in accordance with the present invention is decreased. When the pixel electrode is a reflective electrode, irregular reflection is reduced.

An electro-optical apparatus in accordance with the present invention consists of any one of the above-described substrates for electro-optical apparatus, an opposite substrate provided with a gap therebetween, and an electro-optical material disposed in the gap. An electro-optical apparatus such as an active matrix liquid crystal panel having high-performance transistor elements can thereby be provided. The electro-optical apparatus is applicable to both a transmission type and of a reflection type, which can be determined by the selection of the material to form the pixel electrode.

Since the electronic device in accordance with the present invention uses the electro-optical apparatus as a display device, the display device has improved reliability.

Further, a projection display apparatus in accordance with the present invention consists of a light source, the above-described electro-optical apparatus for modulating light from the light source, and a projection optical means for projecting the light modulated by the electro-optical apparatus. The electro-optical apparatus in accordance with the present invention is most suitable for the use as a light valve of a projection display apparatus for irradiating strong light towards the electro-optical apparatus.

Furthermore, a method for driving an electro-optical apparatus in accordance with the present invention having a transistor provided to each of a matrix of pixel regions, the gate electrode of the transistor being connected to a scanning signal line, consists of applying a selection potential to the scanning signal line to bring the transistor to a conductive state, applying an image signal to the pixel through a channel region of the transistor, and applying a non-selection potential to the scanning signal line to bring the transistor to a non-conductive state so that excessive charges are drained from the channel region in the transistor. In accordance with the present invention, the substrate floating effect is suppressed by draining the excessive carriers (charges) accumulated in the channel region, hence the withstand voltage of the transistor is improved and kink of the current-voltage relationship is suppressed. It is preferable that the carriers (charges) be drained through the scanning signal line or a capacitor line.

DETAILED DESCRIPTION OF PREFERRED EMBODIMENTS

Preferred embodiments of the present invention will now be described with reference to the drawings.

First Embodiment

Figure 1:
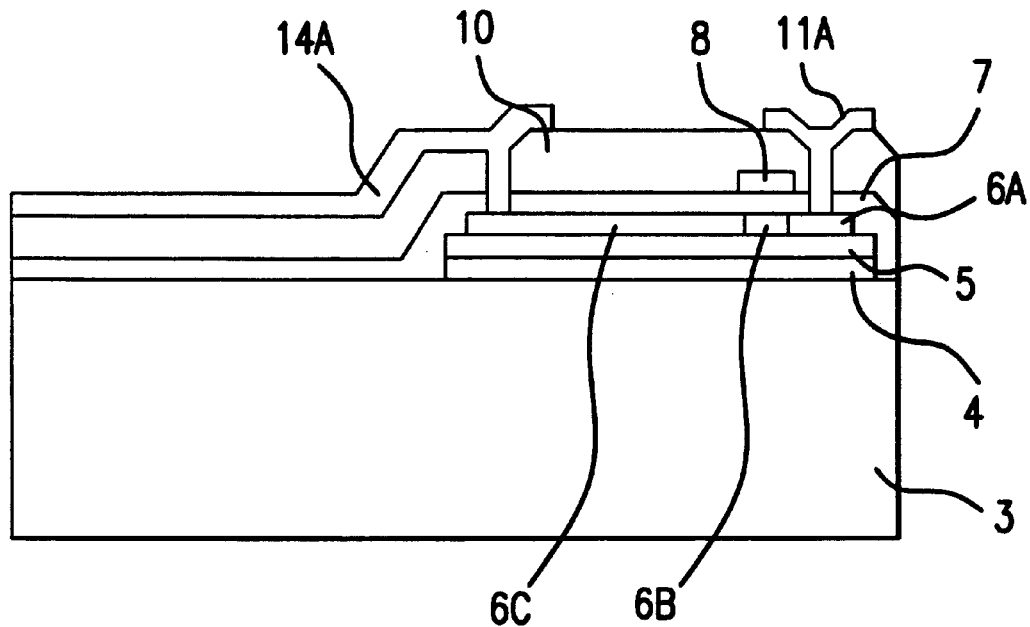
FIG. 1 is a cross-sectional view of a substrate for a liquid crystal panel in a first embodiment of the present invention.

FIG. 1 is a cross-sectional view of a first embodiment showing a pixel section of a substrate for a liquid crystal panel as an example of an electro-optical apparatus in accordance with the present invention. FIGS. 9(A) and 9(B) and FIGS. 10(A) and 10(B) are plan views of pixel sections of substrates for a liquid crystal panel in accordance with the present invention. The same reference number in these drawings indicates the same element.

As shown in FIG. 1, the substrate for a liquid crystal panel in accordance with the first embodiment has MOS semiconductor device of an SOI structure which is produced by an SOI technology.

A light shielding layer 4 is formed above a supporting substrate 3 to prevent occurrence of a light leakage current in the thin film transistor elements. The light shielding layer 4 shields light incident on the transistor elements from the rear side when the supporting substrate 3 is transparent. A first insulating film 5 is formed above the light shielding layer 4 by an SOI technology, and a semiconductor layer is formed above the first insulating film 5. In this embodiment, in order that the transistor element is an n-channel thin film transistor, a source region 6A and a drain region 6C composed of an n-type diffusion layer containing a high concentration of n-type impurity, and a channel region 6B composed of a p-type diffusion layer containing a high concentration of p-type impurity are formed in the semiconductor layer. A second insulating film 7 as a gate insulating film is formed above the channel region 6B and a gate electrode 8 is formed above the second insulating film 7 to form a transistor element. A third insulating film 10 is formed above the gate electrode 8 and a source electrode 11A is formed above the third insulating film 10.

In the present invention, an insulating gate-type field effect transistor will be described as an example of the MOS semiconductor device. The transistor formed on such an insulating material is called a thin film transistor (TFT).

In this embodiment, quartz glass with a thickness of 1.1 mm is used as the supporting substrate 3. Materials for the supporting substrate 3 are not limited to this embodiment. For example, transparent substrates such as OA glass substrates, and non-transparent substrates such as single-crystal silicon substrates (semiconductor substrates) may be used. When a semiconductor substrate is used, a local-oxidation-of-silicon (LOCOS) film must be formed on the surface thereof. In all cases, a surface, where at least elements are formed having insulation characteristics, is used for the supporting substrate 3.

The light shielding layer 4 is obtained by depositing molybdenum with a thickness of approximately 100 to 1,000 nm by a sputtering process prior to the formation of the semiconductor layers 6A, 6B and 6C by the SOI technology In this embodiment, the thickness of the deposited molybdenum is 400 nm. Materials for the light shielding layer 4 are not limited to this embodiment. Any materials can be used without problems as long as it is stable at a maximum temperature of thermal processes for device production. Examples of preferable materials include high melting point metals, such as tungsten and tantalum, polycrystalline silicon, and silicides, such as tungsten silicide and molybdenum silicide. Examples of forming methods used include a CVD process and an electron beam thermal deposition process, in addition to the sputtering process. The light shielding layer 4 is not necessary when a non-transparent substrate is used as the supporting substrate 3.

Next, the first insulating film 5 is deposited to secure insulation between the light shielding layer 4 and the source region 6A, the drain region 6C or the channel region 6B formed thereon. The first insulating film 5 used is a silicon oxide film. The silicon oxide film is formed by, for example, a sputtering process or a plasma enhanced CVD process using tetraethyl orthosilicate (TEOS). In this embodiment, a silicon oxide film with a thickness of 1,000 nm is deposited by a plasma enhanced CVD process using TEOS.

A single-crystal silicon substrate is adhered on the surface of the supporting substrate 3 by an SOI technology, and most of it is cleaved or etched to form a single-crystal silicon thin film (semiconductor layer) on the surface of the supporting substrate 3. This is patterned to form a single-crystal silicon section. The channel region 6B is formed in the single-crystal silicon section by ion implantation of a p-type impurity, and the source region 6A and the drain region 6C are formed by ion implantation of an n-type impurity. An extended section 6D of the single-crystal silicon section is simultaneously formed in the channel region 6B, and the p-type impurity is also doped therein by ion implantation as in the channel region. Furthermore, the single-crystal silicon section of the drain region 6C is extended to form a capacitor electrode section 6E as one electrode of a holding capacitor, and the capacitor electrode section 6E is doped with the n-type impurity being the same as that in the drain by ion implantation. The single-crystal silicon section is doped with impurities so that it has conductivity by activation. In this embodiment, an n-channel transistor is arranged, hence the channel region 6B and the extended section 6D are p-type semiconductor layers, while the source region 6A, the drain region 6C, and the capacitor electrode section 6E are n-type semiconductor layers. When a p-channel transistor is arranged, the channel region 6B and the extended section 6D must be n-type semiconductor layers, while the source region 6A, the drain region 6C, and the capacitor electrode section 6E must be p-type semiconductor layers. The impurity concentration in the channel region 6B and the extended section 6D must be lower than the impurity concentration in the source region 6A, the drain region 6C and the capacitor electrode section 6E. If the impurity concentration in the channel region 6B is higher, a leakage current increases in a non-conductive state of the transistor. The impurity concentration in the extended section 6D forming the contact may be the same as that in the channel region 6B, but is preferably higher than that in the channel region 6B to drain charges from the channel region 6B. The latter configuration can decrease resistance of the extended section 6D and contact resistance at the contact section so that charges can be readily drained. The impurity concentration in the extended section can be enriched by implanting an impurity in the extended section 6D in the impurity doping step for the channel region 6B and then by implanting an impurity having the same conductivity type only in the extended section 6D.

As will be described below, in the capacitor electrode section 6E, the semiconductor layer of the drain region 6C is extended to a position just below a scanning signal line 8A connected to the gate electrode of the transistor of the adjacent pixel and is used as one electrode of the holding capacitor (accumulate capacitor) Cs. The capacitor electrode section 6E is overlapped with the scanning signal line 8A through the insulating film 7 to form the holding capacitor of the pixel.

The gate insulating film 7 composed of the second insulating film is formed to secure insulation between the source region 6A, the drain region 6C or the channel region 6B and the gate electrode 8 composed of a first conductive film. The second insulating film is composed of a silicon oxide film. In this embodiment, this silicon oxide film is formed by a low-temperature-oxide (LTO) process. This insulating film may be a thermal oxide film or a nitride film. Alternatively, this insulating film may be a plurality of layers.

The first conductive film 8 composed of polycrystalline silicon and so on is formed as the gate electrode. The first conductive film 8 may have a silicide structure in which a high melting point metal is deposited on polycrystalline silicon.

As will be described with reference to FIGS. 10(A)–(B), the channel region 6B is electrically connected to the preceding scanning signal line 8A (Xn−1) adjacent to the scanning signal line 8A (Xn) for driving the channel region 6B (wherein subscript i of Xi is an integer and represents the order of the scanning signal line selected within a vertical scanning period). The third insulating film 10 composed of an insulating film such as a boron-phosphorussilicate glass (BPSG) film is formed above the first conductive film to secure insulation between the gate electrode 8 and the source electrode 11A. A second conductive layer composed of aluminum as the source electrode 11A is formed above the third insulating film 10 so as to be connected to the source region 6A via a contact hole provided in the third insulating film 10. A pixel electrode 14 is formed so as to be connected to the drain region 6C via a contact hole provided in the third insulating film 10. A transparent conductive film such as indium tin oxide (ITO) is used as the pixel electrode.

FIGS. 9(A)–10(B) and are plan views of pixel sections based on the cross-sectional configuration shown in FIG. 1.

Figure 9A:
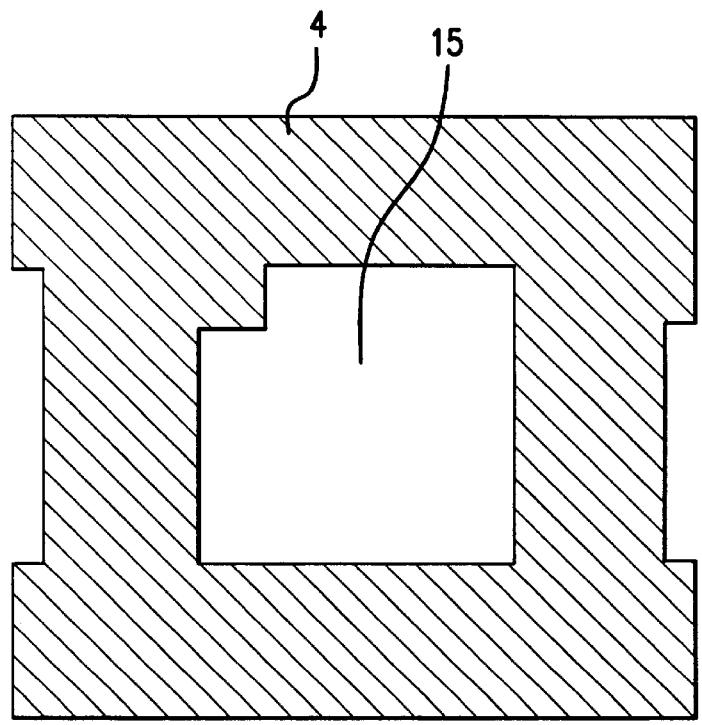
FIGS. 9(A)–(B) are plane views of a substrate for a liquid crystal panel in a first embodiment of the present invention.

FIG. 9(A) shows a state in which a light shielding layer 4 is formed on a substrate 3 by the above-mentioned process and a region 15 of the light shielding layer 4 for forming a pixel electrode is opened by patterning. The pattern shown in the drawing is adapted when the supporting substrate 3 is a transparent substrate such as a glass and so on and the pixel electrode 14 is a transparent electrode.

Figure 9B:
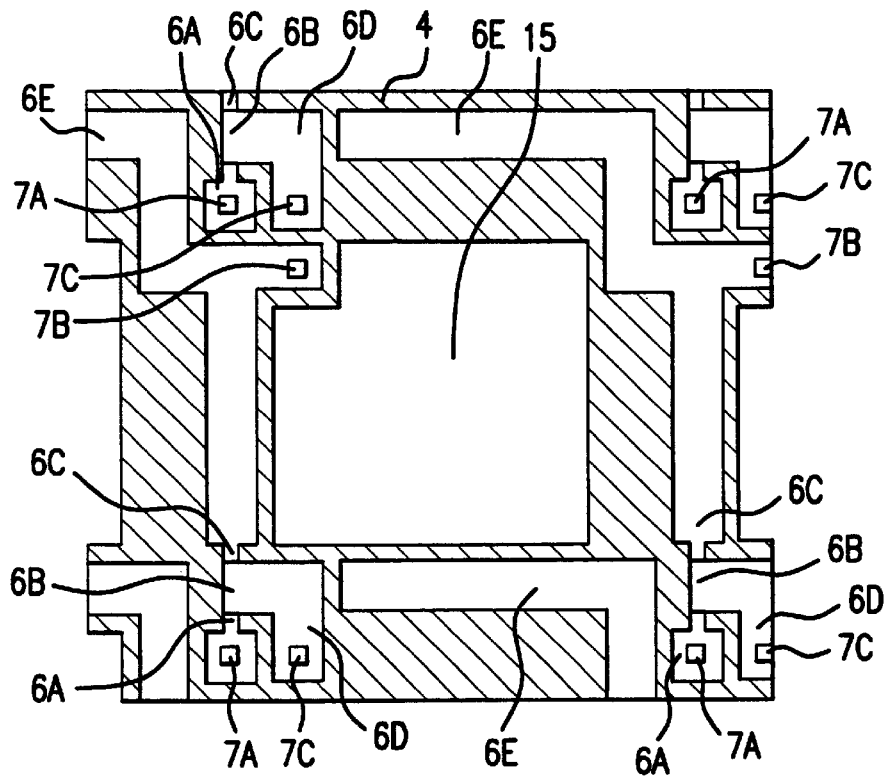

FIG. 9(B) shows a pattern in which a single-crystal silicon layer 6 is formed and patterned by the above-mentioned process on a light shielding layer 4 formed as shown in FIG. 9(A). Numeral 6A and numeral 6C represent an n-type source region and an n-type drain region formed in the single-crystal silicon layer, respectively. Numeral 6B represents a p-type channel region formed in the single-crystal silicon layer. A single-crystal silicon layer 6D extending from the channel region 6B is an extended section doped with a p-type impurity as in the channel. A single-crystal silicon layer 6E extending from the drain region 6C is a capacitance electrode section doped with an n-type impurity as in the drain.

The source region 6A is connected to a source electrode 11A via a contact hole 7A. The source electrode 11A is used as an image signal line as will be described below. The drain region 6C extends towards the direction of the image signal line 11A (the upper portion of the drawing) and is connected to the pixel electrode 14A via a contact hole 7B, as will be described below. The drain region 6C extends to the left side of the drawing and forms the capacitor electrode section 6E which overlaps with an adjacent scanning signal line 8A through an insulating film 7. The holding capacitor Cs is composed of a pair of electrodes, that is, the scanning signal line 8A and the capacitor electrode section 6E through the second insulating film 7. The extended section 6D from the channel region 6B is electrically connected to a preceding scanning signal line 8A via a contact hole 7C, as will be described below.

Figure 10A:
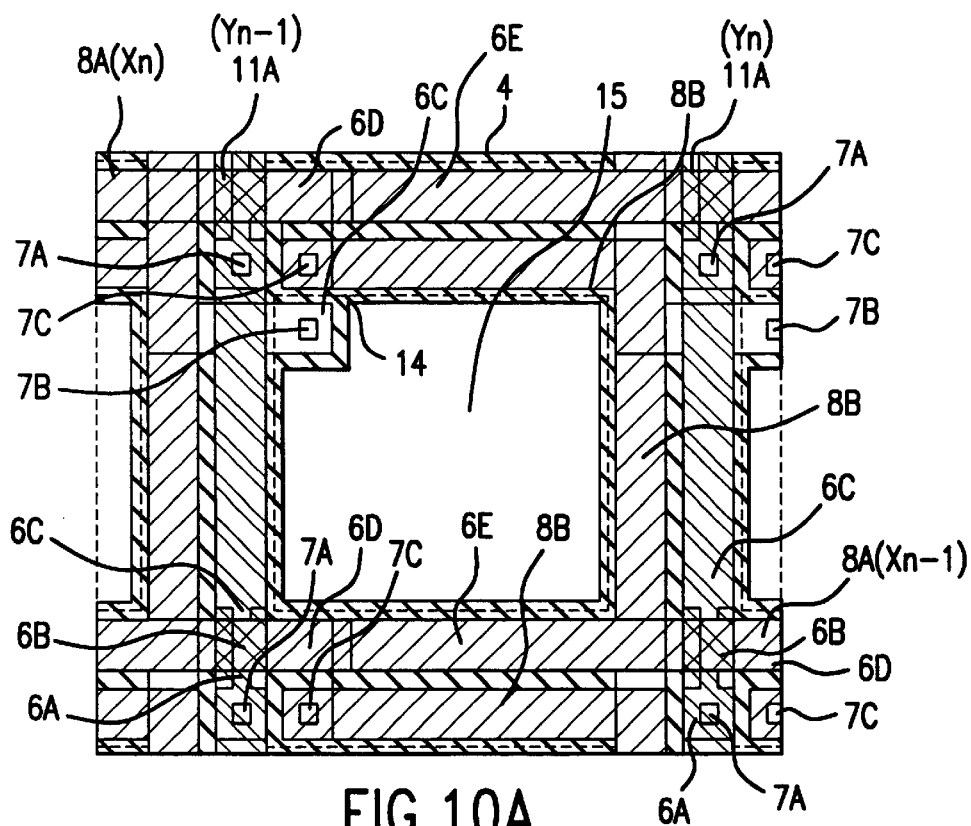
FIGS. 10(A)–(B) are plane views of a substrate for a liquid crystal panel in a first embodiment of the present invention.
Figure 10B:
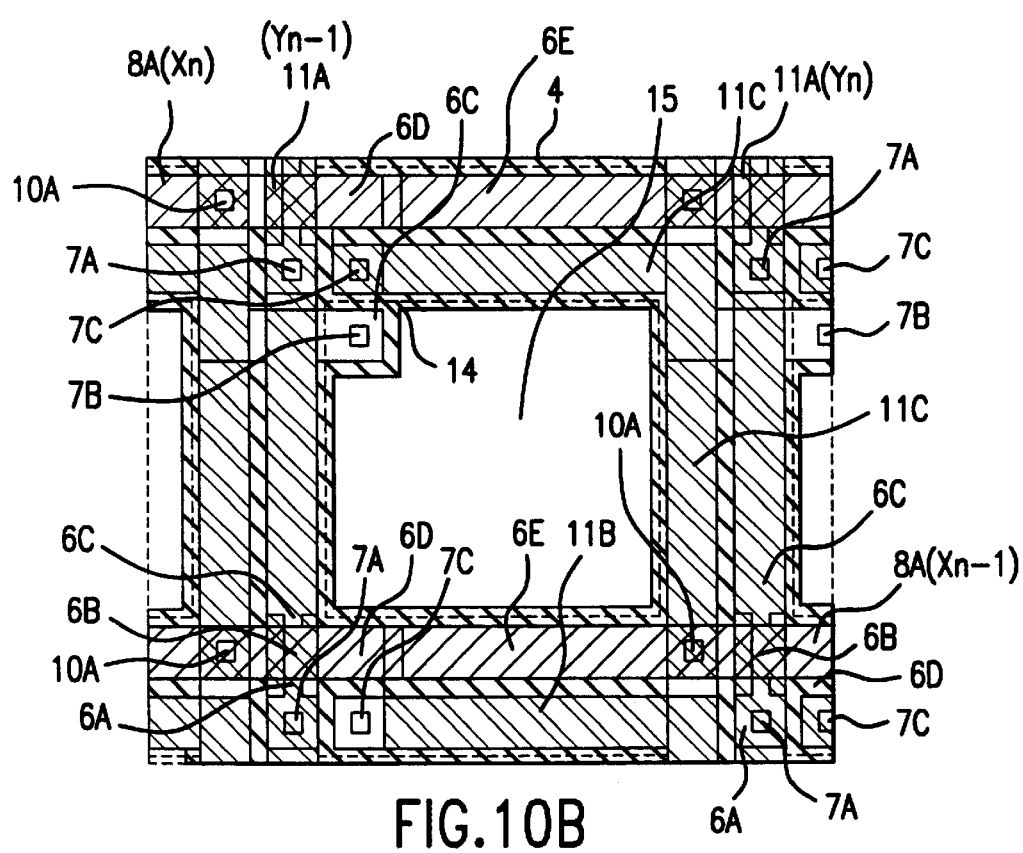

FIGS. 10(A) and 10(B) show plan views in which a gate insulating films 7, a gate electrode 8, an insulating film 10, a source/drain electrode 11, and a pixel electrode 14 are formed on a single-crystal silicon layer 6.

In FIG. 10(A), the wiring layer section-hatched upwardly to the right indicates a first conductive film, and the wiring layer densely section-hatched downwardly to the right indicates a second conductive film. Dotted lines indicate the end of a pixel electrode 14.

A first conductive film forms a scanning signal line and a wiring connected to an extended section 6D extending from a channel region 6B in the transistor element via a contact hole 7C. The first conductive films arranged in parallel in the transverse direction in the drawing indicate scanning signal lines 8A. The portion in which a scanning signal line 8A overlaps with the channel region 6B through the insulating film 7 is a gate electrode, and the source, the drain, the channel, the gate insulating film and the gate electrode form a thin film transistor (TFT). A source electrode 11A is formed on the insulating film 10 provided on a scanning signal line 8A. The source electrode 11A is connected to the source region 6A via a contact hole 7A formed in the insulating films 7 and 10 and functions as an image signal line Y. A drain region 6C is connected to the pixel electrode 14 via a contact hole 7B formed in the insulating films 7 and 10. A capacitor electrode section 6E extends below a scanning signal line 8A of an adjacent pixel and overlaps it through the insulating film 7 to form a holding capacitor.

The extended section 6D extending from the channel region 6B in accordance with the present invention is connected to a wiring 8B lying in the same layer as the scanning signal line branched from a preceding scanning signal line 8A (Xn−1) via a contact hole 7C formed in the insulating film 7. The wiring 8B extends along an image signal line 11A and is connected to the extended section 6D extending from the channel of the transistor in a succeeding pixel via the contact hole 7C provided in the vicinity of the transistor in the succeeding pixel.

Since excessive carriers accumulated in the channel region are drained through the path of the extended section 6D, the wiring 8B, and the preceding scanning signal line 8A (Xn−1), the substrate floating effect can be suppressed. The scanning signal lines 8A are sequentially scanned, and a selection potential is applied during the selection period while a non-selection potential is applied during the non-selection period. When a succeeding scanning signal line 8A (Xn) is in the selection period after the preceding scanning signal line 8A (Xn−1) is selected, the preceding scanning signal line 8A (Xn−1) enters the non-selection state until the next frame. Thus, the excessive carriers from the channel of the transistor connected and conducted to the selected scanning signal line 8A (Xn) are drained to the preceding scanning signal line 8A (Xn−1) which has already entered the non-selected period and is in a stable non-selection potential. Since the non-selection potential is generally equal to or lower than a minimum potential of the image signal applied to the pixel electrode from the image signal line 11A through the transistor, the excessive carriers can be drained to the preceding scanning signal line in the non-selection potential.

The wiring 8B is formed with the scanning signal line 8A in the same layer by being branched from the scanning signal line 8A. Since the specific resistance of a scanning signal line 8A having a silicide structure is lower than that of the extended section 6D, the extended section 6D is not extended at length but the conductive layer of the scanning signal line 8A is branched to reduce the total resistance from the channel region 6B to the scanning signal line 8A. The branched wiring 8B is arranged along the image signal line 11A so as to overlap in a flattened manner with the light shielding layer 4 thereunder, resulting in combined light shielding. Since the image signal line 11A and the wiring 8B are present in different layers, an overlapping arrangement of these two lines results in a decrease in the light shielding region and an increase in the aperture percentage. The wiring 8B is also arranged along the scanning signal line 8A so as to overlap in a parallel manner with the light shielding layer 4 thereunder, resulting in combined light shielding.

FIG. 10(B) shows an embodiment which is different from that shown in FIG. 10(A). The configurations of that shown in FIG. 9(A) and that shown in FIG. 9(B) are the same in FIG. 10(A) and FIG. 10(B). Furthermore, the pattern shape and structure in which a gate insulating film 7, a gate electrode 8, an insulating film 10, a source/drain electrode 11, and a pixel electrode 14 are formed on a single-crystal silicon layer 6 are the same as those in FIG. 10(A). A difference in the configuration is that the wiring, which is connected to the extended section 6D extending from the channel region 6B of the thin film transistor element via the contact hole 7C, is not formed by the wiring 8B branched from the scanning signal line 8A, but is formed of a wiring 11C composed of a second conductive film lying in the same layer as the overlying image signal line (and the source electrode) 11A. The wiring 11C is connected to the preceding scanning signal line 8A (Xn−1) via a contact hole 10A provided in the insulating film 1, and to the extended section 6D via the contact hole 7C. Excessive carriers are drained through the path of the extended section 6D, the wiring 11C, and the preceding scanning signal line 8A (Xn−1) to suppress the substrate floating effect Since, the image signal line 11A and the wiring 11C are conductive layers with low resistance composed of aluminum or the like, the total resistance from the channel region 6B to the preceding scanning signal line 8A (Xn) can be reduced to readily drain the excessive carriers in the channel.

By disposing the wiring 11C along the image signal line 11A, the wiring 11C can be overlapped in a parallel manner with the light shielding layer 4 thereunder, resulting in combined light shielding. Also, by disposing the wiring 11C along the scanning signal line 8A, the wiring 11C can be overlapped in a parallel manner with the light shielding layer 4 thereunder, resulting in combined light shielding.

Figure 11:
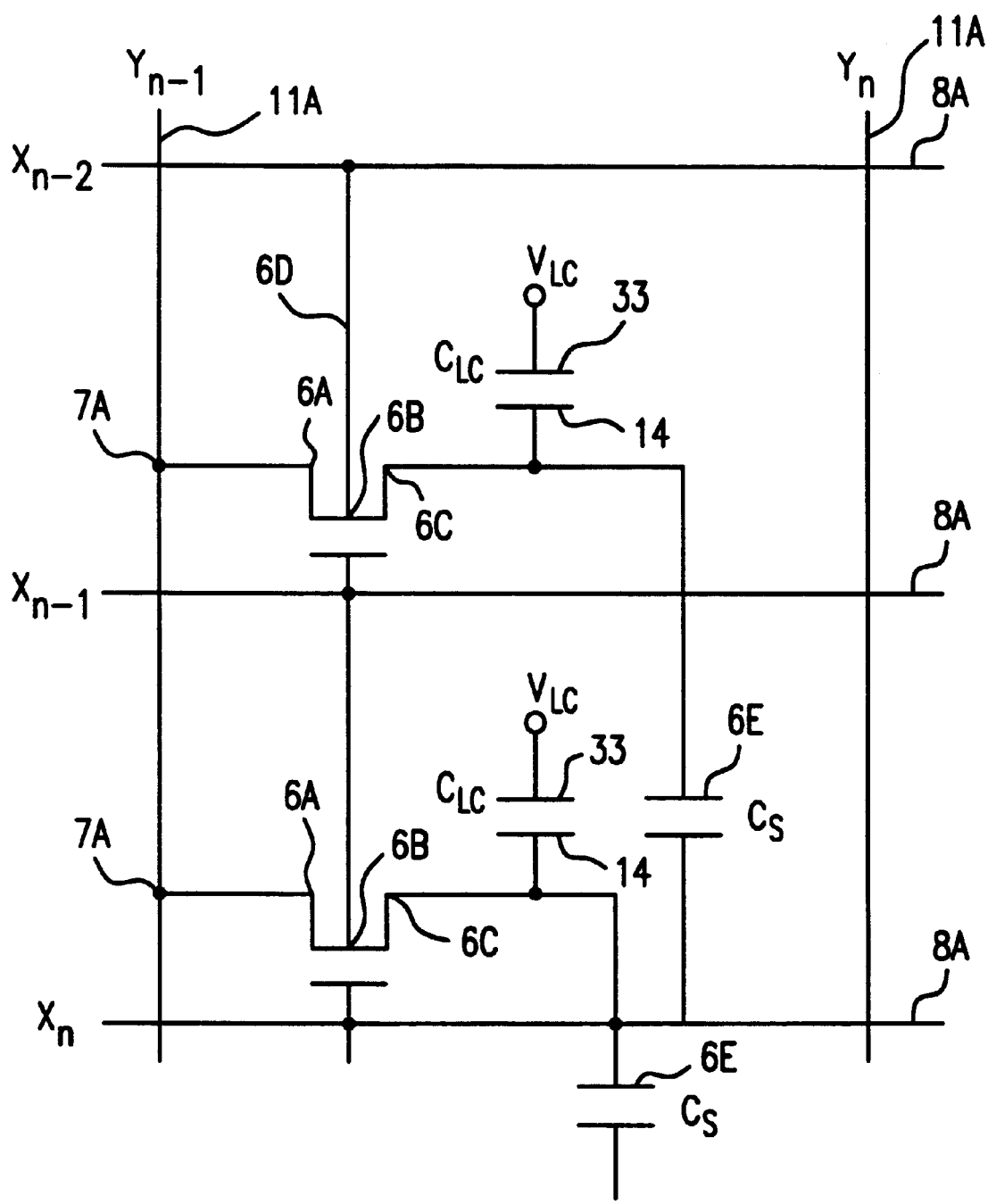
FIG. 11 is an equivalent circuit diagram of a substrate for a liquid crystal panel in a first embodiment of the present invention.

FIG. 11 is an equivalent circuit diagram of a liquid crystal panel comprising the substrate for a liquid crystal panel in accordance with this embodiment, an opposing substrate, and a liquid crystal layer provided therebetween. In particular, FIG. 11 is an equivalent circuit diagram based on the planar configuration shown in FIG. 10.

In a liquid crystal panel of an active matrix liquid crystal display device, image signal lines 11A (Yn−1, Yn) and scanning signal lines 8A (Xn−2, Xn−1, Xn) are arranged on a matrix plane, and a thin film transistor element is provided in the vicinity of each crossing on the plane. A source 6A of the transistor is connected to an image signal line 8A, a gate electrode is connected to the scanning signal line 8A, and a drain 6C is connected to a pixel electrode 14 and a capacitor electrode 6E. The pixel electrode 14 faces an opposite electrode 33 across the liquid crystal layer, and drives the liquid crystal provided between the two electrodes. A common potential $V_{LC}$ as a reference potential for reversing the polarity is applied to the opposite electrode 33, and the pixel electrode 14 and the opposite electrode 33 form a liquid crystal capacitor $C_{LC}$ containing the liquid crystal layer as a dielectric material. Furthermore, the capacitor electrode 6E forms a holding capacitor (storage capacitor) Cs at the region between the succeeding scanning signal line 8A (Xn) and itself Thus, a pixel includes a transistor, and a liquid crystal capacitor and a holding capacitor connected thereto.

A channel region 6B of the transistor is electrically connected to the scanning signal line precedent to the scanning signal line for driving the transistor. That is, the transistor in which the gate is electrically connected to the scanning signal line 8A (Xn) is electrically connected to the preceding scanning signal line 8A (Xn−1). Thus, the channel region of each transistor is electrically connected to the adjacent preceding scanning signal line (gate electrode) to drain the excessive carriers accumulated in the channel region through the scanning signal line; hence the substrate floating effect is suppressed.

Drive of the liquid crystal panel and drainage of the excessive carriers from the channel region of the transistor will now be described with reference to a drive timing diagram shown in FIG. 12.

Symbol $V_G$ represents a scanning signal waveform applied to the scanning signal line 8A (Xn−1). The scanning signal has a selection potential $V_{G1}$ during the selection period $T_2$ which comes during each vertical scanning period to turn on the n-channel TFT in this embodiment. Then, it has a low non-selection potential $V_{G2}$ during the non-selection period $T_2$ to turn off the TFT. Because of sequential drive, the selection potential is applied to the succeeding scanning signal line 8A (Xn) immediately after the selection period $T_1$, and the procedure is repeated.

Symbol $V_{ID}$ represents a potential waveform of an image signal applied to the image signal line 11A. Symbol $V_C$ represents a central potential of the image signal $V_{ID}$. The image signal $V_{ID}$ has a potential waveform having a reverse polarity with respect to the central potential $V_C$ during each vertical scanning period (frame or field). Symbol $V_P$ represents a pixel electrode potential formed when the image signal $V_{ID}$ from the image signal line 11A is applied to the pixel electrode 14 through the n-channel thin film transistor of this embodiment Symbol $V_{LC}$ represents a common potential applied to the opposite electrode 33. The common potential $V_{LC}$ has a potential so that the polarity of the pixel electrode potential $V_P$ is substantially symmetrically reversed, hence the liquid crystal layer is driven by an alternating current preventing dislocation of the polarity applied to the liquid crystal layer and thus also preventing deterioration of the liquid crystal.

Symbol $\Delta V$ represents a potential difference of the pixel electrode potential $V_P$ based on the parasitic capacitance of the n-channel TFT. For the duration of the selection period $T_1$, the channel region 6B of the n-channel TFT accumulates charges, and the parasitic capacitance between the drain region 6C and the gate electrode (scanning signal line) 8 accumulates charges. The charges flow towards the drain when the potential of the gate electrode decreases to the non-selection potential during the non-selection period $T_2$, and is applied to the pixel electrode 14. Thus, the pixel electrode potential $V_P$ which is charged to the same level as that of the image signal line 11A during the selection period $T_1$ is decreased by $\Delta V$, resulting in a decrease in a potential applied to the liquid crystal layer. The $V_{LC}$ is, therefore, shifted so that the pixel electrode potential $V_P$ has a symmetrical waveform with respect to the zero potential. The written voltage is, however, not sufficiently used and $V_{LC}$ is controlled with difficulty; hence it is preferable that $\Delta V$ be as small as possible in order to improve the display quality. Thus, the excessive carriers must be reduced. Accordingly, the excessive carriers are drained from the channel region. In particular, when the TFT has a channel region of single-crystal silicon having high charge transportability, the excessive carriers are apt to be left at an OFF state of the TFT. The configuration in accordance with the present invention can, therefore, improve the display quality.

In the n-channel TFT of this embodiment, charges accumulated in the channel region 6B are electrons (negative charges) occurring when the image signal $V_{ID}$ passes through the channel region. The channel region 6B is electrically connected to the preceding scanning signal line 8A being in a non-selection period $T_2$ after the selection period $T_1$ and having the non-selection potential $V_{G2}$. Since the non-selection potential $V_{G2}$ is lower than a minimum potential of the image signal $V_{ID}$, the charges accumulated in the channel region 6B flow towards the preceding scanning signal line 8A. Thus, the non-selection potential $V_{G2}$ must be equal to or lower than the potential of the image signal $V_{ID}$.

Since the channel region is connected to the scanning signal line, there is a reset effect for erasing image data written in the pixel. The transistor in which the gate is connected to the Xn scanning signal line 8A is electrically connected to the Xn−1 scanning signal line 8A adjacent to the Xn scanning signal line 8A. In the n-channel transistor, when a high selection potential is applied to the Xn−1 scanning signal line, the (p-type) channel region 6B of the transistor connected to the Xn scanning signal line has a higher potential than that of the (n-type) drain region 6C adhered thereto. Thus, a bias in the normal direction is applied to the p-n junction formed between the (p-type) channel region and the (n-type) drain region. As a result, a current flows through the p-n junction, and the potential of the image signal accumulated in the liquid crystal capacitor and the holding capacitor in the Xn pixel during the former frame disappears. Immediately after, however, a high selection potential is supplied to the Xn scanning signal line having a low non-selection potential, and the image signal is written in the liquid crystal capacitor and the holding capacitor by conduction of the transistor. When the frame frequency of the scanning signal line is 60 Hz, after the potential of the image signal disappears, the potential will be rewritten within only 10 to 20 msec. Thus, humans cannot observe disappearance of the data.

In the first embodiment and the following embodiments, the source and the drain of the transistor are mutually changeable. That is, the drain may be connected to the image signal line, and the source may be connected to the pixel electrode 14 and the capacitor electrodes 6E.

Figure 13:
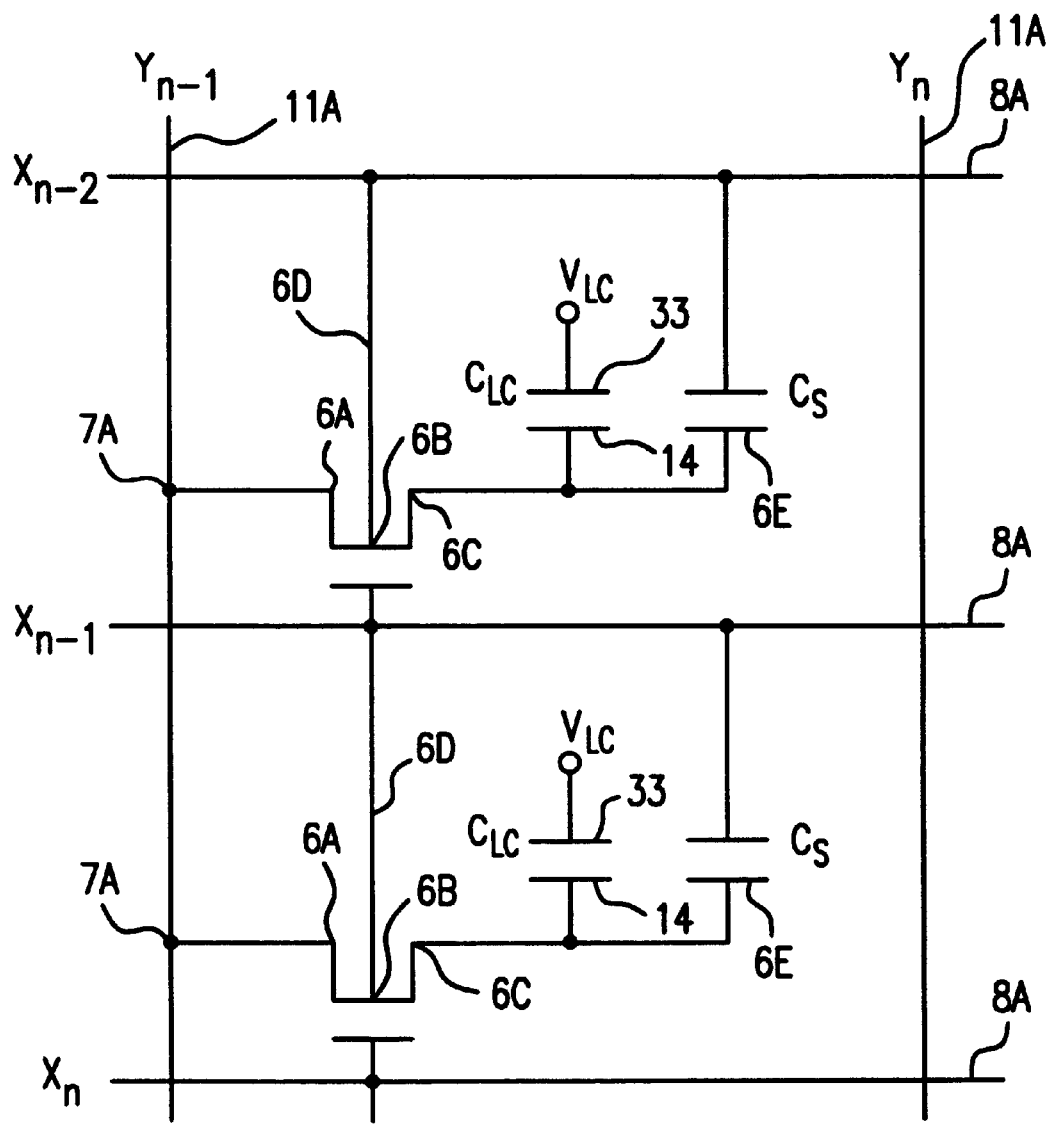
FIG. 13 is an equivalent circuit diagram of a substrate for a liquid crystal panel in a first embodiment of the present invention.

In FIGS. 9(A)–11, the holding capacitor Cs of each pixel is formed of the capacitor electrode section 6E, the succeeding scanning signal line 8A, and the insulating film disposed therebetween, but is not limited in the present invention. That is, the holding capacitor Cs may be composed of the capacitor electrode section 6E and the opposing preceding scanning signal line 8A separated by the insulating film. FIG. 13 is an equivalent circuit diagram of liquid crystal panel pixels in which a holding capacitor Cs is formed between the holding electrode and the preceding scanning signal line 8A. FIGS. 11 and 13 are different from each other in that the other electrode of the holding capacitor Cs is either the succeeding scanning signal line (FIG. 11) or the preceding scanning signal line (FIG. 13), and the same advantages in the present invention are achieved even if the preceding scanning signal line forms the holding capacitor Cs shown in FIG. 13 or the like.

Figure 14:
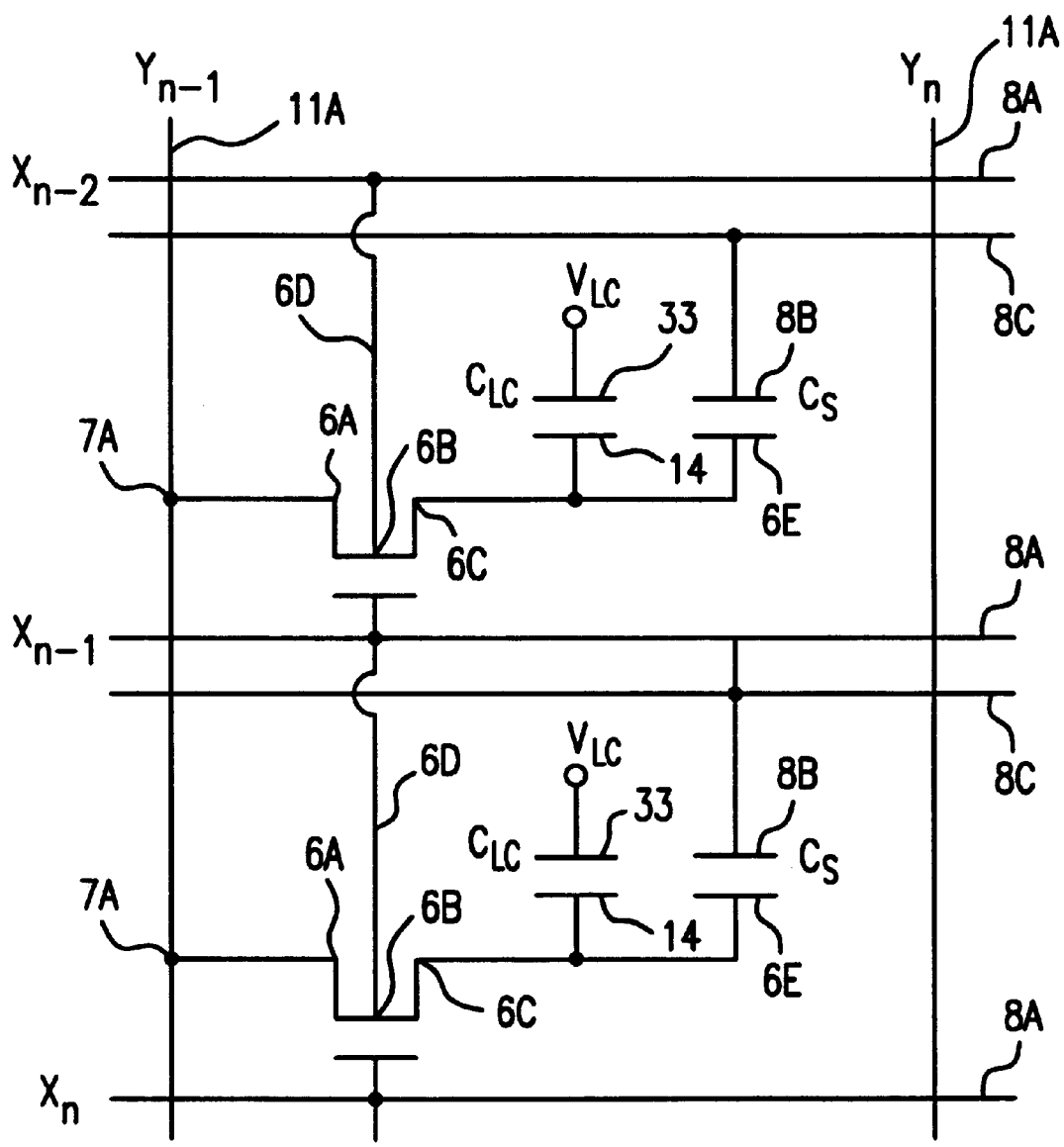
FIG. 14 is an equivalent circuit diagram of a substrate for a liquid crystal panel in a first embodiment of the present invention.

A holding capacitor may be formed by additionally disposing a capacitor line and opposing the capacitor line or an electrode connected thereto and the opposing capacitor electrode section 6E with an insulating film sandwiched therebetween. FIG. 14 is an equivalent circuit diagram of liquid crystal panel pixels in which the holding capacitor Cs is formed of the capacitor electrode section and a capacitor line SC. FIGS. 11 and 14 are different from each other only in that the other electrode of the holding capacitor Cs is either the succeeding scanning signal line (FIG. 11) or the capacitor line (FIG. 14). The same advantages in the present invention are achieved even if the capacitor line 8C forms the holding capacitor Cs shown in FIG. 14 or the like. The potential $V_{LC}$ in FIG. 12 is applied to the capacitor line 8C.

In each embodiment, the preceding scanning signal line connected to the channel region is the immediately preceding scanning signal line (for example, Xn−1 with respect to Xn), but the two-fold preceding scanning signal line (for example, Xn−2 with respect to Xn) or the three-fold preceding scanning signal line (for example, Xn−3 with respect to Xn) is also applicable. Although these preceding scanning signal lines can achieve the advantages in the present invention, a nearer scanning signal line, in particular the immediately preceding scanning signal line is preferred.

Although an embodiment using the n-channel transistor has been described, the same configuration and pattern can be obtained even if the n-channel transistor is replaced by p-channel transistor, and thus resulting in the same advantages. The order between the signal potential levels is inverted, so that the upper section in the drawing has a low potential and the lower section has a high potential. Thus, by setting the non-selection potential $V_{G2}$ applied to a scanning signal line 8A to be over the maximum potential of the image signal $V_{ID}$, the excessive carriers of positive holes (positive charges) accumulated in the channel region 6B of the p-channel transistor can be drained through the scanning signal line 8A.

Second Embodiment

The following embodiment describes a substrate for a liquid crystal panel as an example of an electro-optical apparatus in accordance with the present invention in which a channel region of a transistor in each pixel is electrically connected to an electrode (electrode of a capacitor line) of a holding capacitor (storage capacitor) provided in each of the pixels. Since the capacitor line is provided in this embodiment, unlike the first embodiment, the holding capacitor is not composed of the scanning signal line, but is composed of the capacitor line.

Since the cross-sectional view in this embodiment is the same as in the first embodiment, description thereof will be omitted. In this embodiment, the same reference numbers as in the first embodiment represent the same parts unless further description.

Figure 15A:
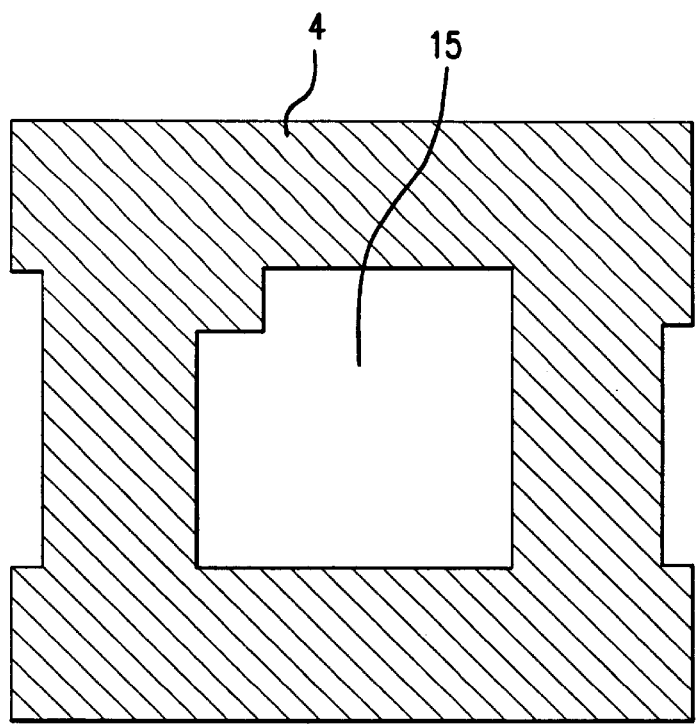
FIGS. 15(A)–(B) are plan views of a substrate for a liquid crystal panel in a second embodiment of the present invention
Figure 15B:
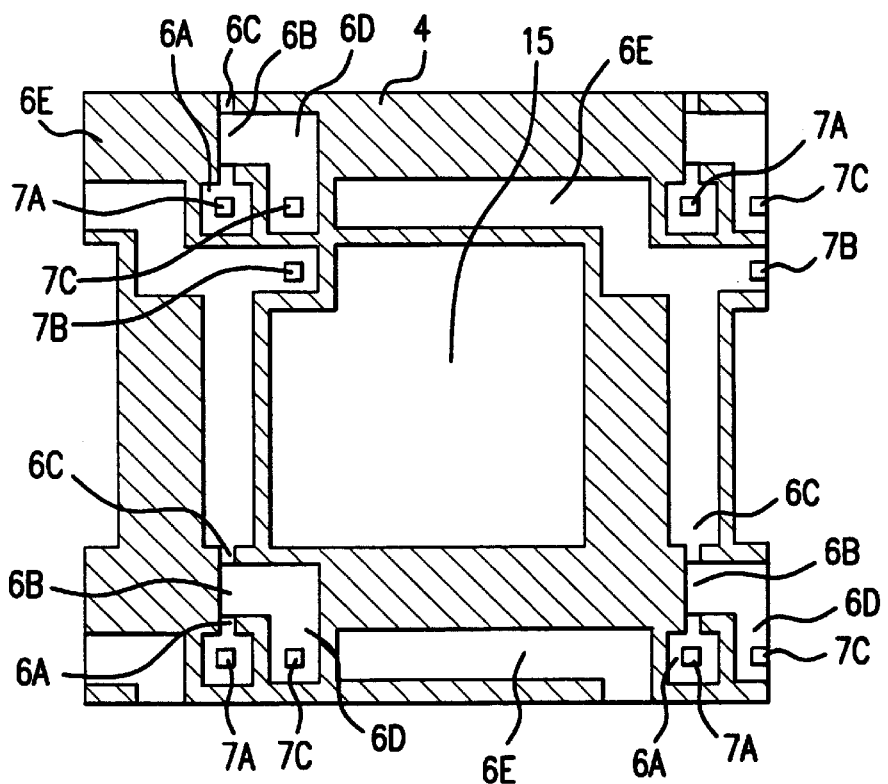

FIGS. 15(A)–16(B) are plan views of pixel sections showing the configurations of this embodiment. FIG. 17 is an equivalent circuit diagram in which the channel region 6B of the transistor is electrically connected to the other electrode of the holding capacitor Cs to drain excessive carriers in the channel region through the capacitor line, and the holding capacitor Cs is formed of the electrode of the capacitor line and the capacitor electrode section 6E. FIG. 15(A) corresponds to FIG. 9(A), FIG. 15(B) corresponds to FIG. 9(B), FIG. 16(A) corresponds to FIG. 10(A), FIG. 16(B) corresponds to FIG. 10(B), and FIG. 17 corresponds to FIG. 11. The same reference numerals represent the same elements.

Figure 16A:
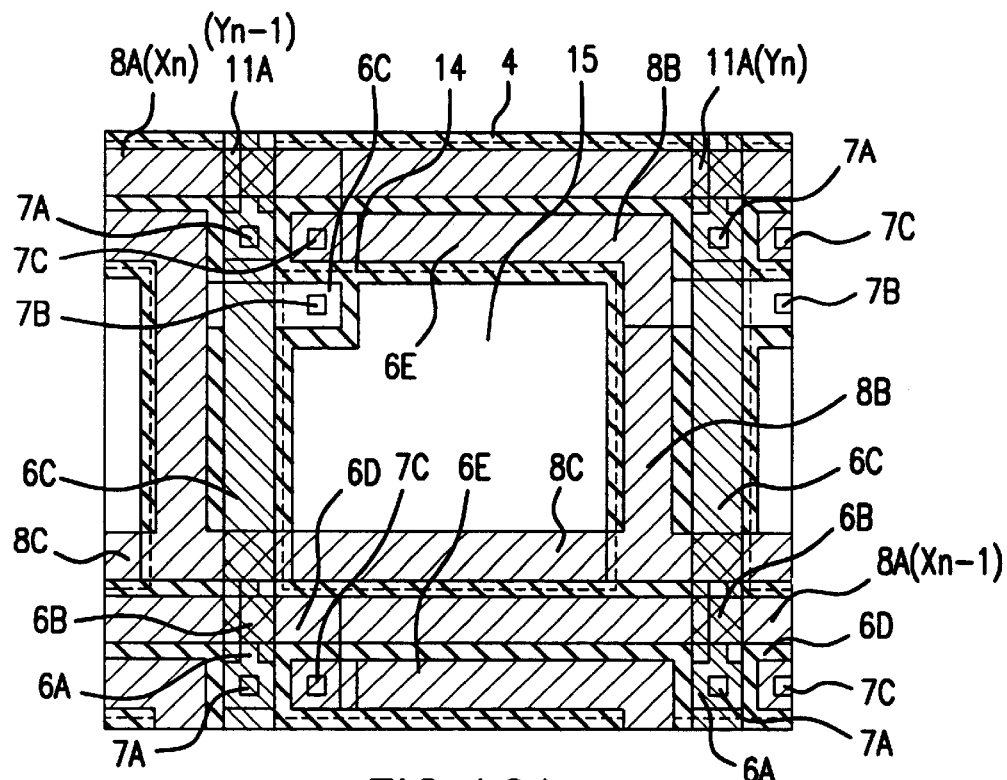
FIGS. 16(A)–(B) are plan views of a substrate for a liquid crystal panel in a second of the present invention.
Figure 16B:
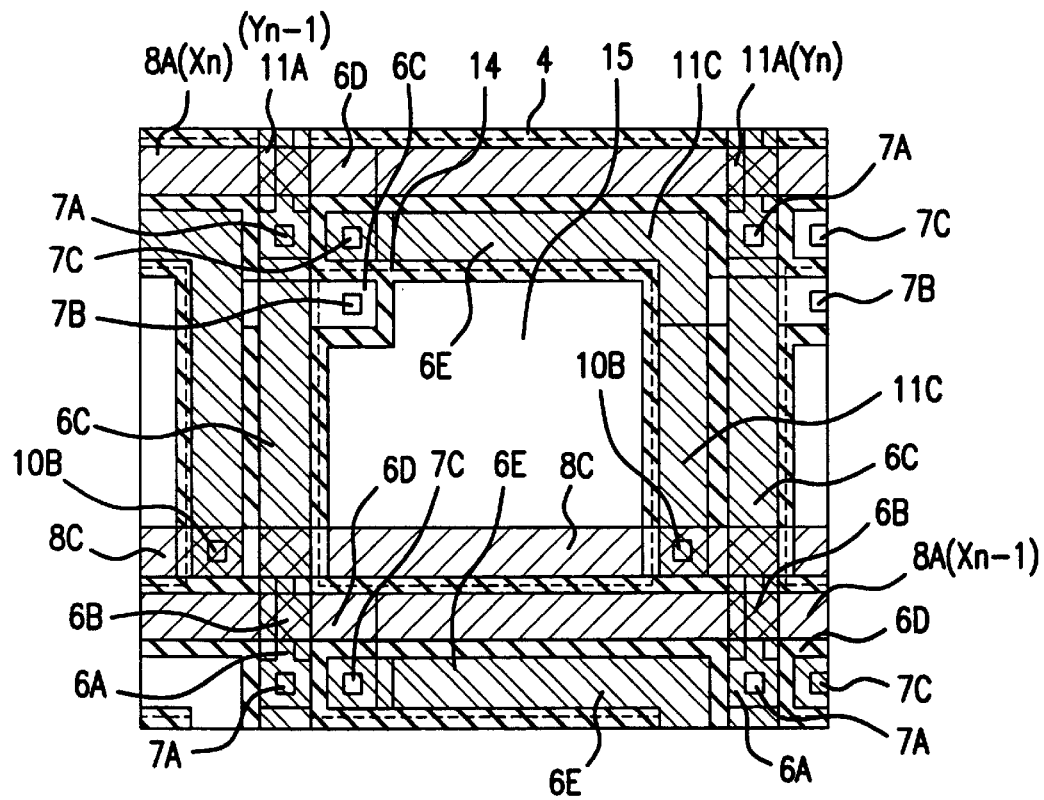
Figure 17:
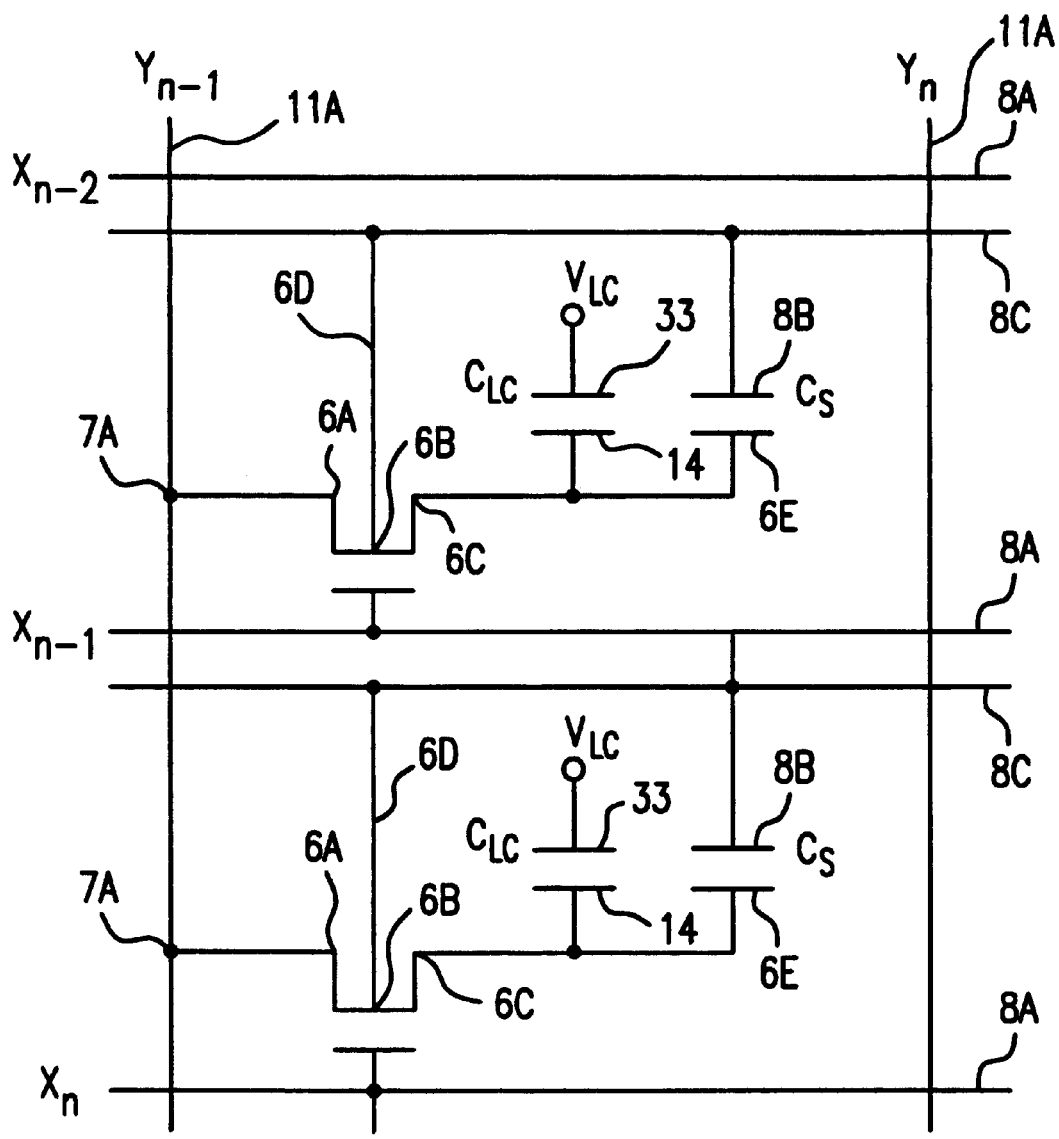
FIG. 17 is an equivalent circuit diagram of a substrate for a liquid crystal panel in a second embodiment of the present invention.

A capacitor line is a conductive wiring formed of a first conductive film 8 shown by reference numeral 8C in FIGS. 16(A), 16(B), and 17. The capacitor line 8C is a conductive wiring arranged parallel to a scanning signal line 8A in the same layer. In FIG. 16(A), the capacitor line 8C has an electrode wiring 8B branched therefrom, and overlaps with the capacitor electrode section 6E of the single-crystal silicon layer 6 separated by the second insulating film to form a holding capacitor Cs. In FIG. 16(B), the capacitor line 8C does not have a branch and is connected to a conductive wiring 11C formed of the second conductive film 11 lying in the same layer as that of the image signal lines 11A via a contact hole 10B provided on the third insulator film 10. The conductive wiring 11C connected to the capacitor line 8C extends and overlaps with the capacitor electrode section 6E of the single-crystal silicon layer 6 through a second insulating film 7 or a third insulating film 10 to form a holding capacitor Cs. In the configuration shown in FIG. 16(B), the capacitance of the holding capacitor Cs is not sufficiently high when the second and third insulating films are dielectric; hence it is preferable that one of the insulating films be removed and the remaining insulating film be dielectric in the section for forming the holding capacitor.

In the configuration shown in FIG. 16(A), the capacitor line 8C is electrically connected to the extended section 6D, which is formed by extending the single-crystal silicon layer (semiconductor layer) of a channel region 6B of the transistor, via a contact hole 7B formed in the second insulating film 7 at the end of the conductive wiring 8B branched from the capacitor line 8C. Thus, excessive carriers accumulated in the channel region 6B of the transistor are drained to the capacitor line 8C through the extended section 6D and the conductive wiring 8B branched from the capacitor line. In the configuration shown in FIG. 16(B), the capacitor line 8C is connected to the overlying the conductive wiring 11C via a contact hole 10B, and electrically connected to the extended section 6D, which is formed by extending the single-crystal silicon layer (semiconductor layer) forming the channel region 6B of the transistor, via the contact hole 7B formed in the second insulating film 7 or a third insulating film, at the end of the conductive wiring 11C. Thus, the excessive carriers accumulated in the channel region 6B of the transistor are drained to the capacitor line 8C through the extended section 6D and the conductive wiring 11C.

Figure 12:
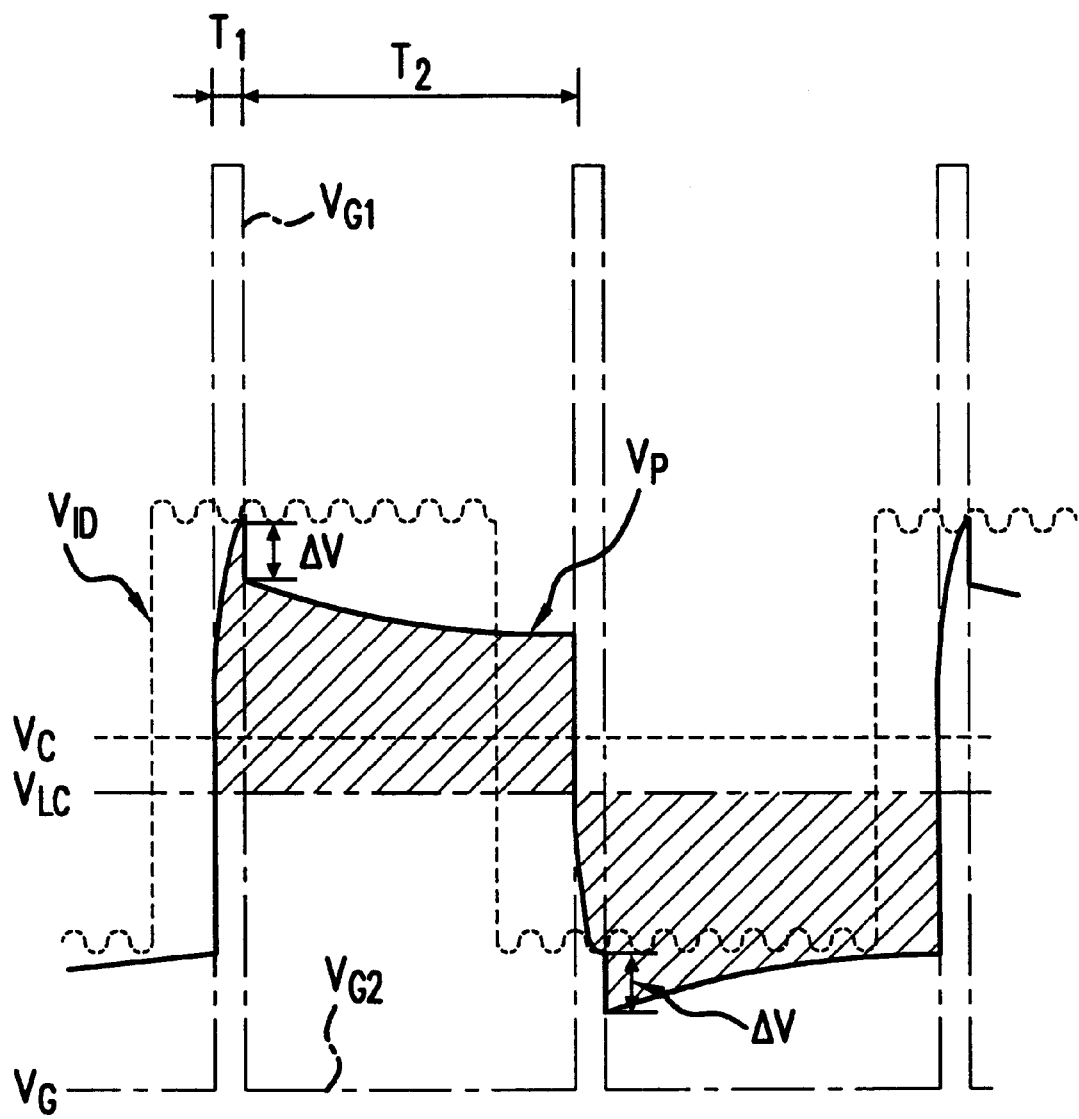
FIG. 12 is a driving waveforms diagram of a liquid crystal panel in the present invention.

In this embodiment, the potential of the capacitor line 8C is set to be the same as the non-selection potential $V_{G2}$ shown in FIG. 12 described in the first embodiment in order to drain the carriers from the channel region. That is, when the transistor is an n-channel TFT, as shown in FIG. 12, a potential equal to or lower than a minimum potential of the image signal $V_{ID}$ is applied to the capacitor line 8C. When the transistor is a p-channel TFT, a potential equal to or higher than a maximum potential of the image signal $V_{ID}$ is applied to the capacitor line 8C.

As described above, in this embodiment, the excessive carriers accumulated in the channel region in the transistor is drained to the capacitor line by the effects which are similar to those in the first embodiment; hence, the substrate floating effect can be reduced In this embodiment, the potential of the capacitor line 8C, to which the drained carriers are forwarded, is always fixed and allows stable drainage of carriers.

Third Embodiment

Figure 2:
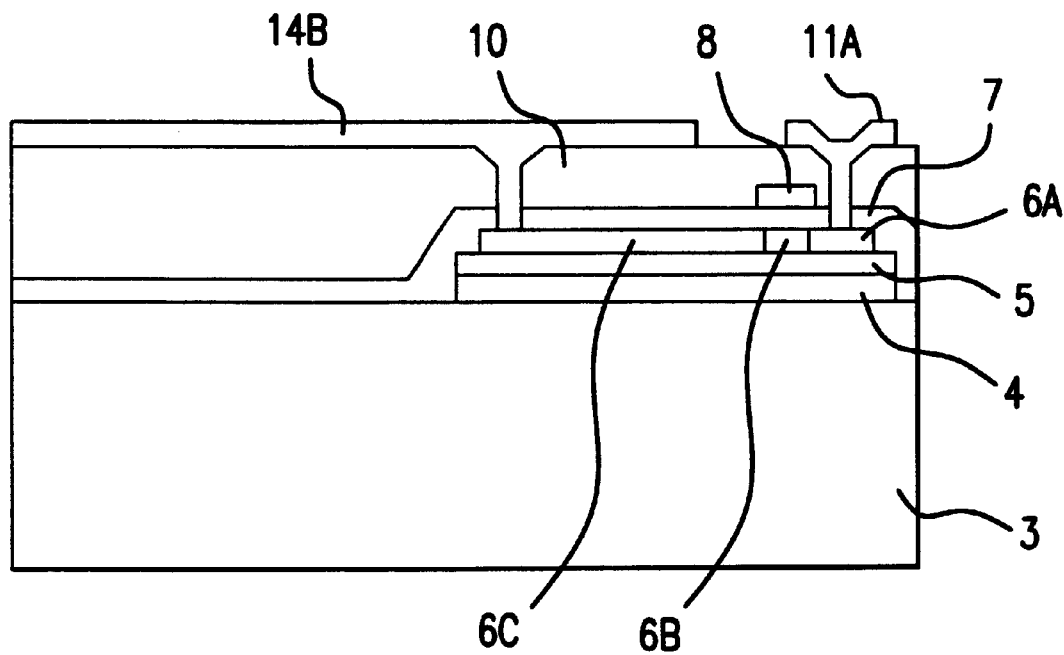
FIG. 2 is a cross-sectional view of a substrate for a liquid crystal panel in a third embodiment of the present invention.

FIG. 2 is a cross-sectional view of a third embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments. That is, in this and the following embodiments, the same numerals as those in the first and second embodiments represent the same elements.

In this embodiment, a mirror reflective electrode is used as a pixel electrode 14B. The reflectance of the reflective electrode varies significantly with the surface state of the underlying third insulating film 10. In order to prevent a change in the reflectance, the third insulating film 10 on the entire surface of the substrate is planarized by polishing. A method for planarization is a chemomechanical polishing (CMP) process. After planarization of the third insulator film 10 by the CMP process, a pixel electrode 14B as a reflective electrode is formed above the planarized third insulating film 10. Aluminum composing the pixel electrode is deposited by a low-temperature sputtering process. A pixel electrode 13 having a reflectance of 90% or higher is produced by such a process. The pixel electrode 14 may be formed by the same process as that for a second conductive film 11A. This is significantly effective in view of simplification of the process.

Fourth Embodiment

Figure 3:
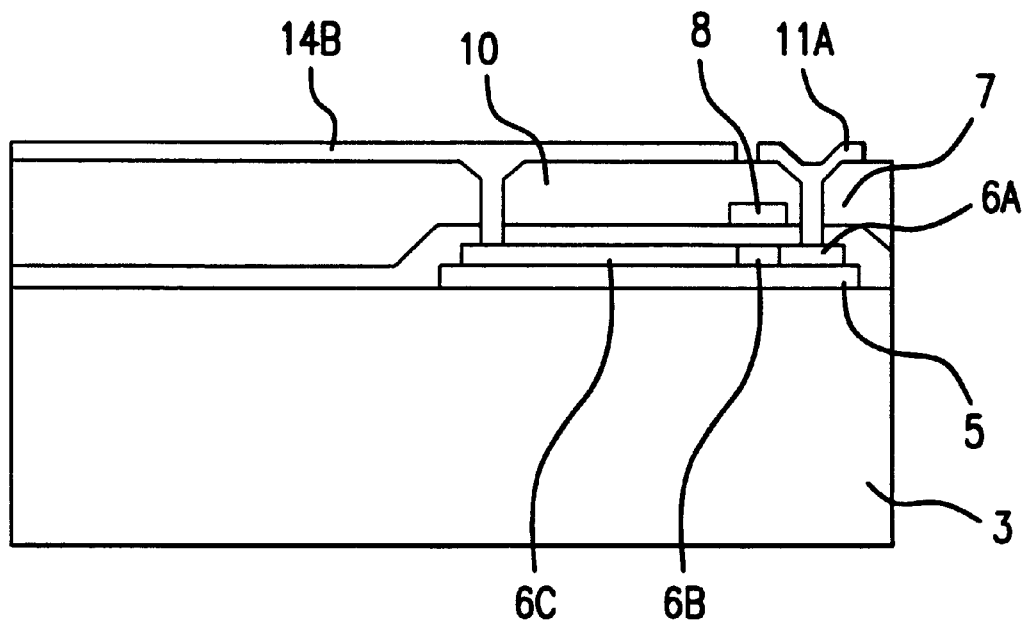
FIG. 3 is a cross-sectional view of a substrate for a liquid crystal panel in a fourth embodiment of the present invention.

FIG. 3 is a cross-sectional view of a fourth embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

Although this embodiment has a similar configuration to that in the third embodiment, a difference is that the pixel electrode is a reflective electrode. As described in this embodiment, when the pixel electrode 14B is the reflective electrode, in order to significantly narrow the gap between the reflective electrode 14B and the source electrode 11A, the conductive film 14 also functions as a light shielding film. Thus, no light shielding layer 4 for preventing light leakage current in the transistor is required. This is significantly effective in view of simplification of the process.

Fifth Embodiment

Figure 4:
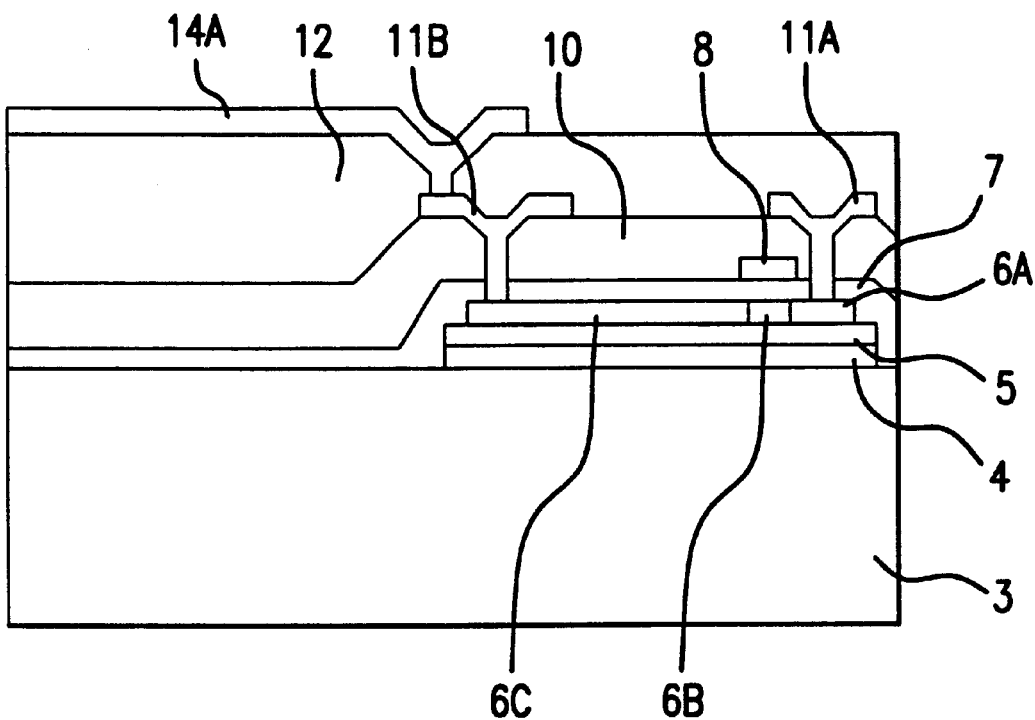
FIG. 4 is a cross-sectional view of a substrate for a liquid crystal panel in a fifth

FIG. 4 is a cross-sectional view of a fifth embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

In this embodiment, a second conductive film 11B is connected to the drain region 6C thorough a third insulating film 10 such as a silicon oxide film, and the second conductive film 11B is connected to the pixel electrode 14A with a fourth insulating film 12 such as a silicon oxide film therebetween. A transparent conductive film such as indium tin oxide (ITO) is used as the pixel electrode. In this embodiment, the third insulating film 10 and the fourth insulating film 12 are separately etched to form individual contact holes. When the third insulating film 10 and the fourth insulating film 12 are composed of different films, for example, silicon nitride (SiN) and silicon dioxide ($SiO_2$) or tantalum oxide ($TaO_x$) and silicon dioxide ($SiO_2$), etching using the same etching gas or etchant readily causes side etching of one insulating film due to a difference in the etching rates of these insulating films, and the shape after etching may be tapered thereby. When etching is performed using etching gases or etchants suitable for each of the insulating films, the shape after etching is satisfactory. Thus, this embodiment is particularly effective when the third insulating film 10 and the fourth insulating film 12 are formed of different films.

Sixth Embodiment

Figure 5:
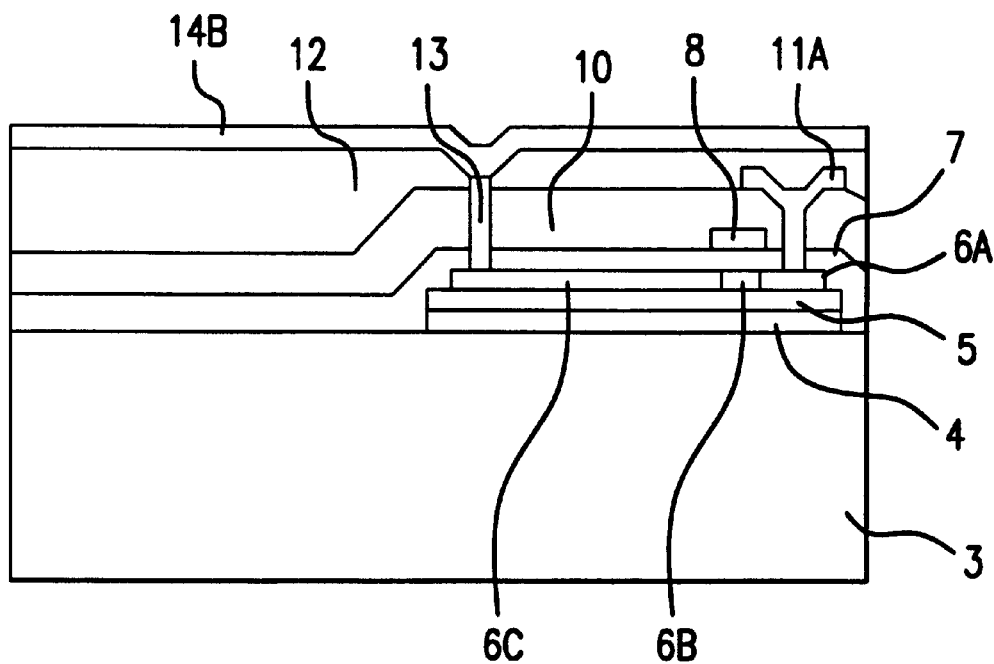
FIG. 5 is a cross-sectional view of a substrate for a liquid crystal panel in a sixth embodiment of the present invention.

FIG. 5 is a cross-sectional view of a sixth embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

Although this embodiment has a similar configuration to that in the fifth embodiment, a difference is that the pixel electrode is a reflective electrode and that the drain region 6C and the pixel electrode 14B as the reflective electrode are electrically connected to each other by a connection plug 13. A high-melting point metal such as tungsten is used as a material for the connection plug 13. The pixel electrode 14B is composed of aluminum by a low-temperature sputtering process. It is not necessary that the second conductive film 11A be a mirror reflective electrode. For example, aluminum with an anti-reflection film such as titanium nitride on the surface can be deposited by a high-temperature sputtering process. Thus, this is significantly effective in view of decreased resistance in the source/drain electrode and in ensuring reliability.

Seventh Embodiment

Figure 6:
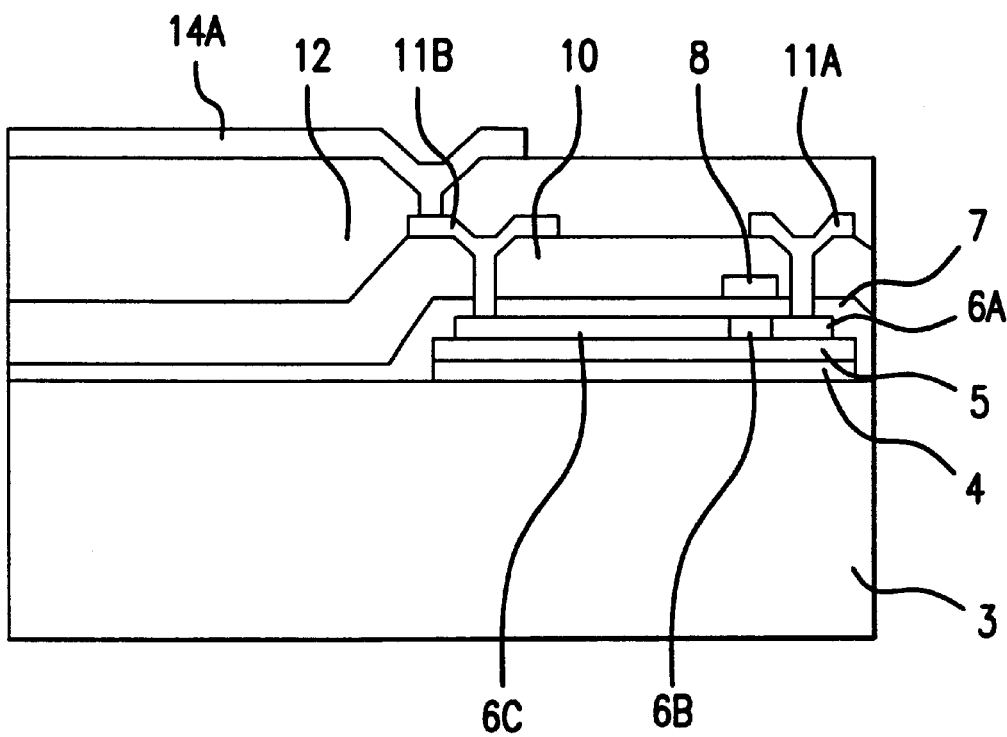
FIG. 6 is a cross-sectional view of a substrate for a liquid crystal panel in a seventh embodiment of the present invention.

FIG. 6 is a cross-sectional view of a seventh embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

In this embodiment, a pixel electrode 14A is formed through a drain region 6C and a second conductive film 11B.

As in the fifth embodiment, the drain region 6C in this embodiment is connected to the second conductive film 11B with the third insulating film 10, such as a silicon oxide film, therebetween, and the second conductive film 11B is connected to the pixel electrode 148 with a first insulating film 12, such as a silicon oxide film, therebetween. The pixel electrode is composed of aluminum by low-temperature sputtering and used as a reflective electrode. In this embodiment, etching is performed using etching gases or etchants suitable for each of the third insulating film 10 and the fourth insulating film 12 as in the fifth embodiment. Since no side etching is performed, the shape after etching is satisfactory. Thus, this embodiment is particularly effective when the third insulating film 10 and the fourth insulating film 12 are composed of different films.

Eighth Embodiment

Figure 7:
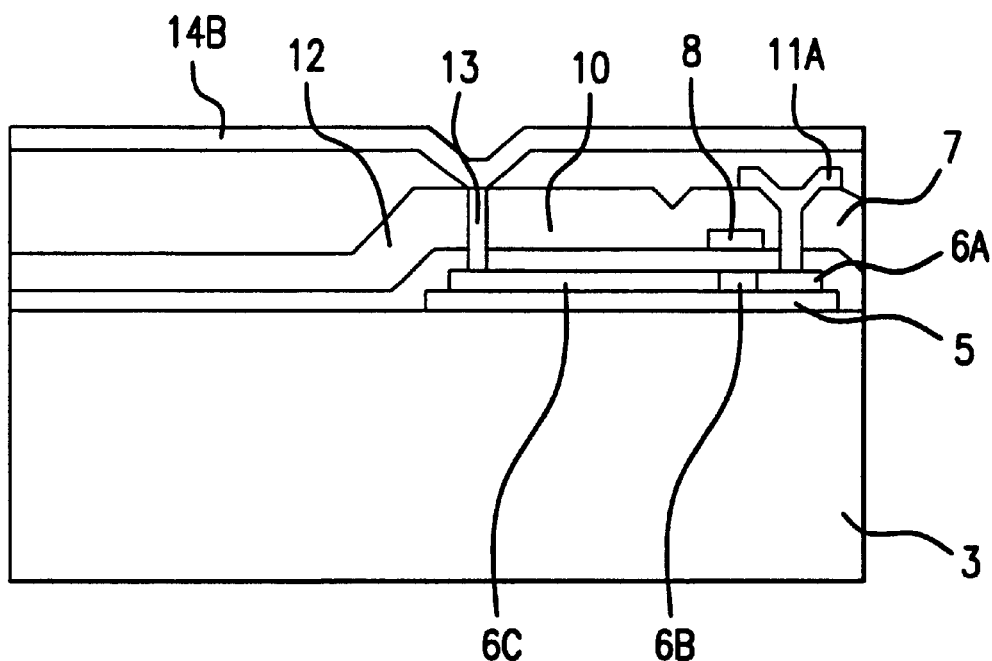
FIG. 7 is a cross-sectional view of a substrate for a liquid crystal panel in an eighth embodiment of the present invention.

FIG. 7 is a cross-sectional view of an eighth embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

Although this embodiment has a similar configuration to that in the sixth embodiment, a difference is that a light shielding layer 4 is not formed. As in this embodiment, when the pixel electrode 14B is a reflective electrode, the gap of the second conductive film 11A is significantly reduced, and further the conductive film described above is act as a light shielding layer, as well. Thus, the formation of the light shielding layer 4 for preventing the light leakage current in the transistor is not necessary. This embodiment is significantly effective in view of simplification in the process.

Ninth Embodiment

Figure 8:
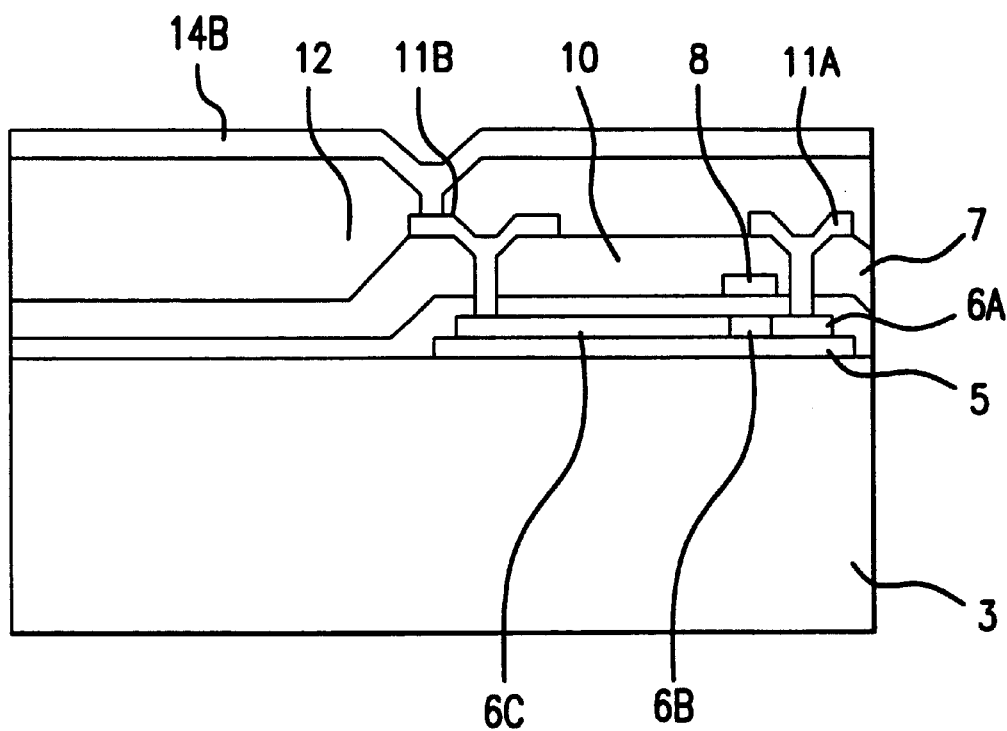
FIG. 8 is a cross-sectional view of a substrate for a liquid crystal panel in a seventh embodiment of the present invention.

FIG. 8 is a cross-sectional view of a ninth embodiment showing a pixel section of a substrate for a liquid crystal panel as an example of substrates for electro-optical apparatuses in accordance with the present invention. This embodiment corresponds to a modification of the cross-sectional view of the pixel section in the first and second embodiments, and the configuration is the same as that in the first and second embodiments, except for portions which are different from those in the first and second embodiments.

Although this embodiment has a similar configuration to that in the seventh embodiment, a difference is that the pixel electrode is a reflective electrode and a light shielding layer is not provided. As in this embodiment, when the pixel electrode 14B is a reflective electrode, the gap of the second conductive film 11A is significantly reduced, and thus the formation of the light shielding layer 4 for preventing the light leakage current in the transistor is not necessary. This embodiment is significantly effective in view of simplification in the process. Also, in this embodiment, etching is performed using etching gases or etchants suitable for each of the third insulating film 10 and the fourth insulating film 12 as in the fourth and sixth embodiments. Since no side etching is performed, the shape after etching is satisfactory. Thus, this embodiment is particularly effective when the third insulating film 10 and the fourth insulating film 12 are composed of different films.

Embodiment of a Liquid Crystal Panel of the Present Invention

A liquid crystal panel configuration as an example of an electro-optical apparatus produced using the substrate for electro-optical apparatuses in accordance with the present invention will now be described with reference to the drawings.

Figure 18:
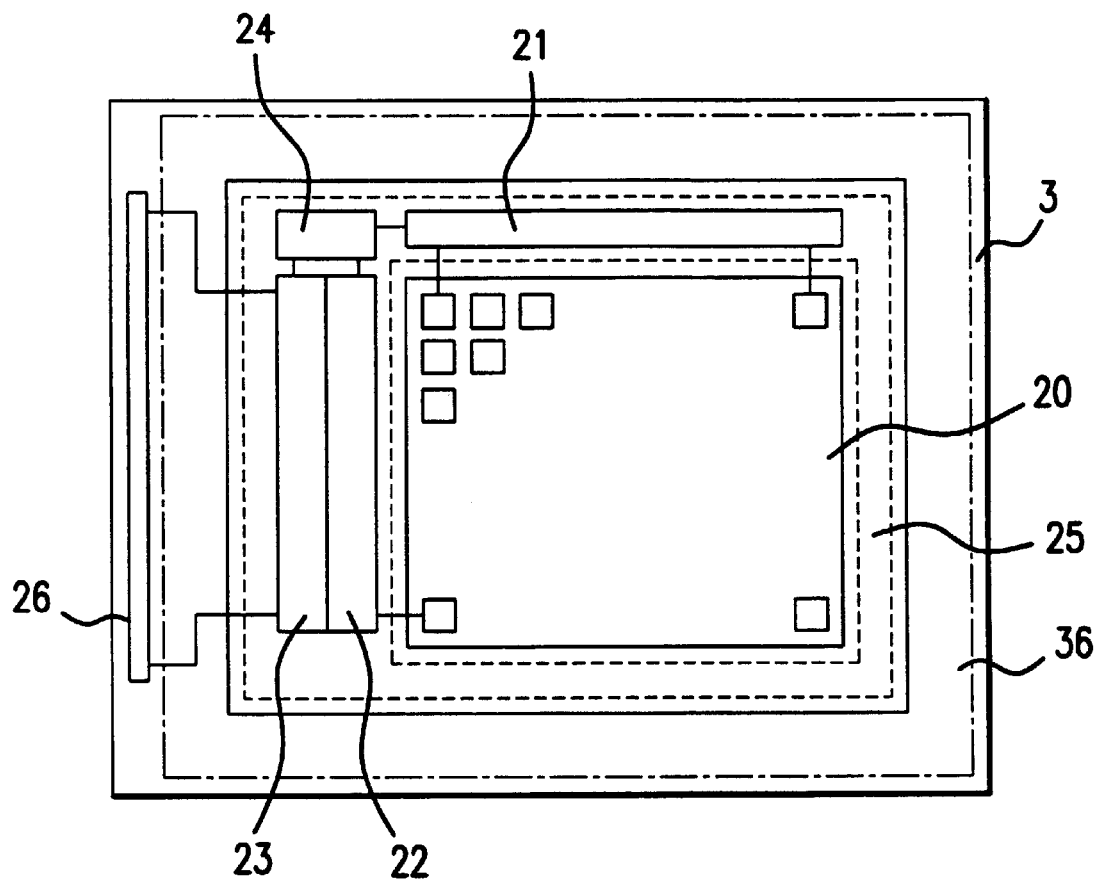
FIG. 18 is a plan view of a substrate for a liquid crystal panel in accordance with the present invention.

FIG. 18 is an entire plan view of a substrate for a liquid crystal panel according to the first to ninth embodiments. As shown in FIG. 18 in this embodiment, light shielding film 25 (a region surrounded by dotted lines in the drawing) is provided in order to prevent incidence of light on the peripheral circuits 21, 22, 23 and 24 provided at the peripheral section of a substrate. The peripheral circuits are provided at the periphery of a pixel region 20 including a matrix of pixel electrodes, and include a data line driving circuit 21 for supplying image signals corresponding to image data to image signal lines 11A, a scanning signal line driving circuit 22 for sequentially scanning signal lines 8A, an input circuit 23 for inputting image data from the exterior through a pad region 26, and a timing controlling circuit 24 for controlling these circuits. These circuits comprise combinations of devices, which are produced on the substrate by similar steps to those for transistor elements formed in the pixels, with load devices such as resistors and capacitors.

In this embodiment, the light shielding film 25 is formed in the same process as that of the second conductive film 11 or the third conductive film 14B shown in FIGS. 1 to 8, and structured so that a predetermined potential, such as an electrical power source voltage, a central potential of image signals, or a common potential $V_{LC}$, is applied thereto. The predetermined potential applied to the light shielding film 25 can reduce reflection compared with floating or the other potential. Numeral 26 represents pads used for supplying the electrical power source voltage or a pad region provided with terminals.

Figure 19:
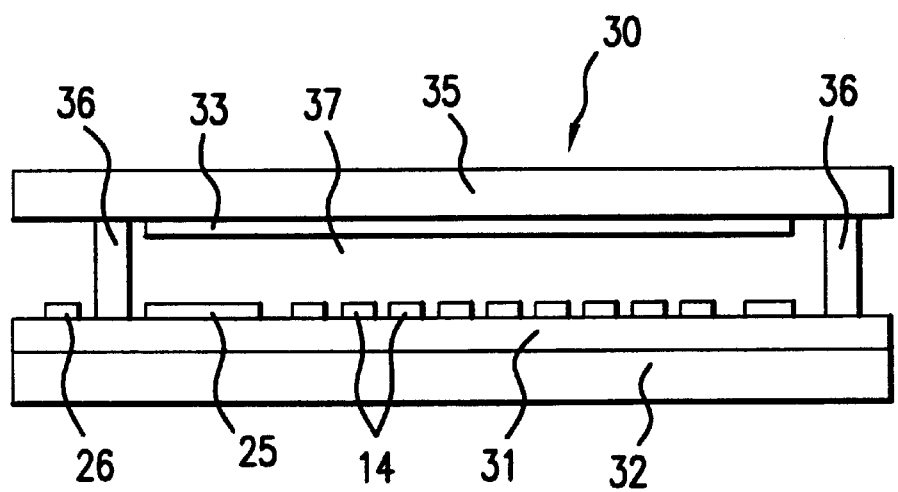
FIG. 19 is a cross-sectional view of a liquid crystal panel in accordance with the present invention.

FIG. 19 shows a cross-sectional configuration of a liquid crystal panel using the substrate 31 for a liquid crystal panel in accordance with the present invention. As shown in FIG. 19, the substrate 31 for a liquid crystal panel in accordance with the present invention may be provided with a reinforcing substrate 32 composed of glass or ceramic and adhered to the rear surface of the substrate with an adhesive, if necessary. Above the surface of the substrate at the incident side, a glass substrate 35 provided with an opposite electrode (common electrode) composed of a transparent conductive film (ITO), to which the common potential VLC is applied, is arranged with a desired distance, and the peripheries are sealed with a sealant 36 to form a gap. The gap is filled with a known liquid crystal 37, such as a twisted nematic (TN) liquid crystal, a homeotropic liquid crystal in which liquid crystal molecules are oriented substantially in the vertical direction when voltage is not applied, a homogeneous liquid crystal in which liquid crystal molecules are oriented substantially in the horizontal direction without twist when voltage is not applied a ferroelectric liquid crystal, or a polymer liquid crystal, to form a liquid crystal panel 30. The position of the sealant is determined so that signals are input from the exterior and so that the pad region 26 is provided at the exterior of the sealant 36.

The light shielding film 25 on the peripheral circuits faces the opposite electrode 33 separated by the liquid crystal 37. When a common potential $V_{LC}$ is applied to the light shielding film 25, it is also applied to the opposite electrode 33; hence a direct current is not applied to the liquid crystal provided therebetween. Thus, for example, molecules of a TN liquid crystal are always twisted by approximately 90°. Accordingly, liquid crystal molecules are always oriented vertically in a homeotropic liquid crystal or horizontally in a homogeneous liquid crystal.

In this embodiment, since the substrate 31 for a liquid crystal panel composed of a semiconductor substrate is provided with a supporting substrate composed of a glass, ceramics or the like adhered to the rear surface of the substrate 31 with an adhesive, strength is significantly enhanced. As a result, when the opposite substrate is adhered after adhering of the supporting substrate 32 to the substrate 31, the gap of the liquid crystal layer becomes uniform over the entire panel.

Figure 20:
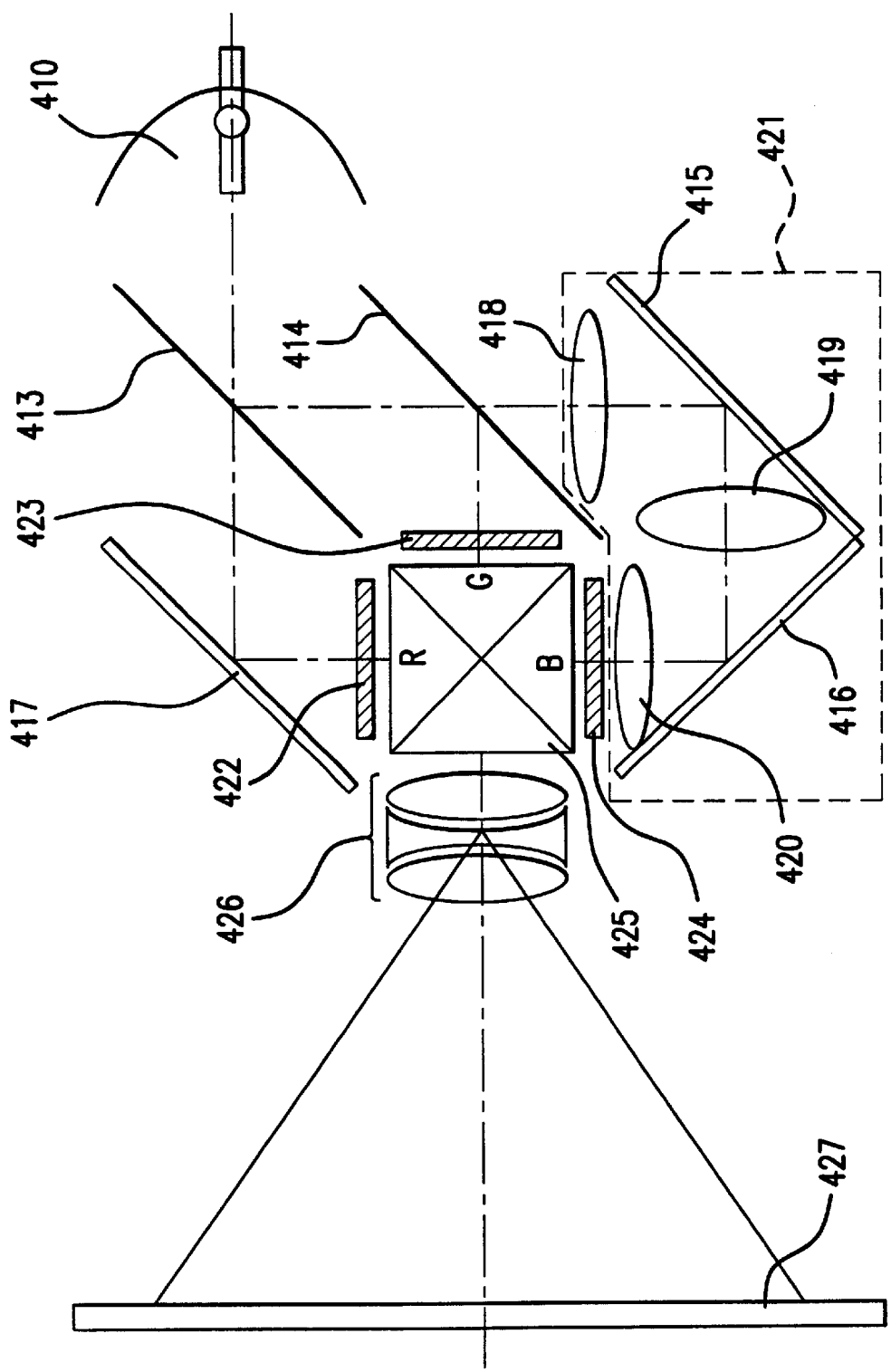
FIG. 20 is an optical schematic view of a projection display apparatus in accordance with the present invention.
Figure 21:
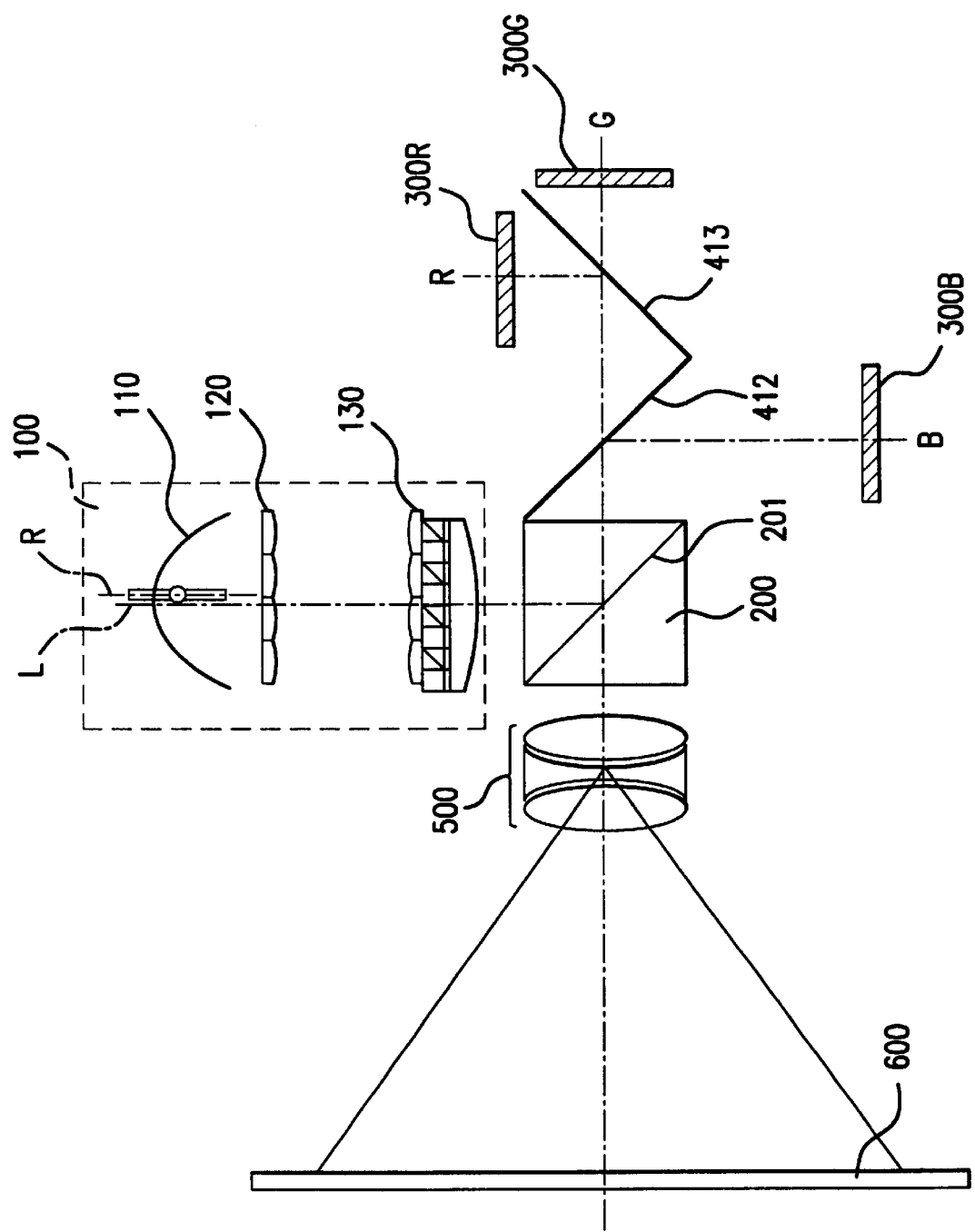
FIG. 21 is an optical schematic view of a projection display apparatus in accordance with present invention.

Description of Projection Display Apparatus using Liquid Crystal Panel of the Present Invention as Light Valve FIGS. 20 and 21 show optical configurations of projection display apparatuses using liquid crystal panels as light valves, which are examples of electro-optical apparatuses in accordance with the present invention.

FIG. 20 is an outline schematic view showing a major part of a projection display apparatus using liquid crystal panels in accordance with the present invention in which the pixel electrode is composed of a transparent conductive film. In the drawing, numeral 410 represents a light source; numerals 413 and 414 represent dichroic mirrors; numerals 415, 416 and 417 represent reflection mirrors; numerals 418, 419 and 420 represent relay lenses; numerals 422, 423 and 424 represent liquid crystal light valves; numeral 425 represents a cross dichroic prism; and numeral 426 represents a projection lens. The dichroic mirror 413 for reflecting blue light and green light transmits red light among white light beams from the light source, and reflects blue light and green light. The transmitted red light is reflected by the reflection mirror 417 and is incident on the liquid crystal light valve 422 for red light. On the other hand, among the color light beams reflected by the dichroic mirrors 413, the green light is reflected by the dichroic mirror 414 for reflecting green light and is incident on the liquid crystal light valve 423 for green light. In contrast, the blue light passes through the second dichroic mirror 414. For the blue light, a guide means 421 including an incident lens 418, a relay lens 419, and an emerging lens 420 is provided, and the blue light is incident on the liquid crystal light valve 424 for blue light via the guide means. Three color light beams modulated in the respective light valves are incident on the cross dichroic prism 425 to recombine these color light beams and thus to form an optical color image. The combined light is projected onto a screen 427 through a projection lens 426, which is a projection optical system, to display an enlarged image.

FIG. 21 is an outline schematic view showing a major part of a projection display apparatus using a liquid crystal panel in accordance with the present invention in which the pixel electrode is composed of a reflective electrode. The apparatus includes a polarization illumination unit 100 including a light source 110, an integrator lens 120 and a polarizing element 130; a polarized beam splitter 200 for reflecting the S-polarized light beams projected from the polarization illumination unit 100 by an S-polarized beam reflecting face 201; a dichroic mirror 412 for separating the blue (B) component out or the light reflected by the S-polarized beam reflecting face 201 contained in polarized beam splitter 200; a reflection liquid crystal light valve 300B for modulating the separated blue (B) component; a dichroic mirror 413 for separating by reflection the red (R) component out of the light beams after separation of the blue component; a reflection liquid crystal light valve 300R for modulating the separated red (R) component; a reflection liquid crystal light valve 300G for modulating the residual green (G) component which passes through the dichroic mirror 413; and a projection optical system 500 for combining the light components modulated in the three reflection liquid crystal light valves 300R, 300G., and 300B in the dichroic mirrors 412 and 413 and the polarized beam splitter 200, and for projecting the recombined light onto a screen 600. These three reflection liquid crystal light valves 300R, 300G, and 300B use the above-described liquid crystal panels.

Since these projection display apparatuses are provided with liquid crystal panels including pixels having a protective structure which can drain excessive carriers in the channel in each transistor, a display is resulted using a high-performance, high-withstand voltage active matrix liquid crystal panel.

Figure 22A:
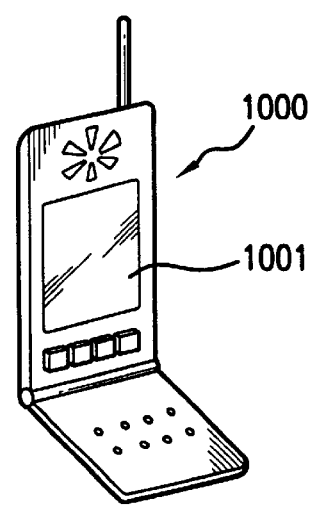
FIGS. 22(A)–(C) are outline views of electronic devices in accordance with the present invention.
Figure 22B:
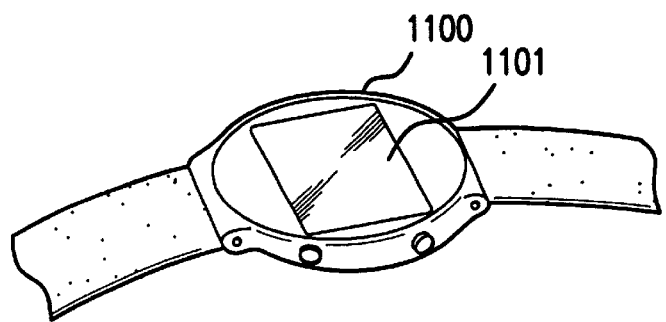
Figure 22C:
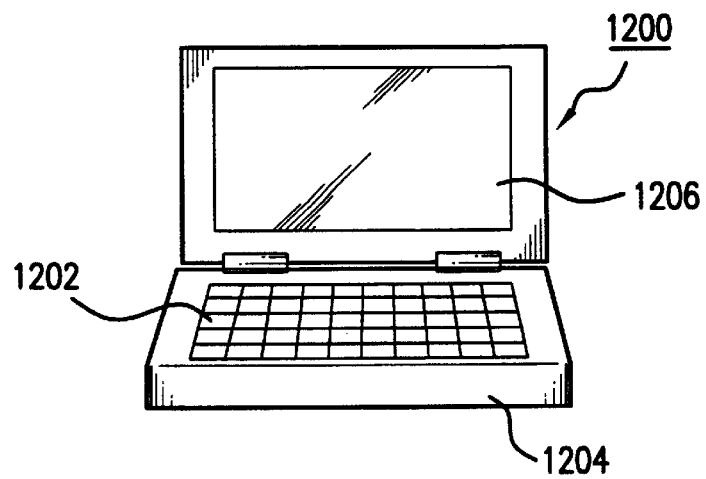

Description of Electronic Apparatus using Liquid Crystal Panel of the Present Invention as Display Device FIGS. 22(A)–(C) show appearances of electronic devices, as examples of the electro-optical apparatuses in accordance with the present invention, using the liquid crystal panels as display devices. FIG. 22(A) shows an example using the liquid crystal panel in accordance with the present invention as a display section 1001 of a portable phone 1000. FIG. 22(B) shows an example using the liquid crystal panel in accordance with the present invention as a display section 1101 of a wristwatch type device 1100. FIG. 22(C) shows an example using the liquid crystal panel in accordance with the present invention as a display section 1206 of a computer 1200. Numerals 1204 and 1202 represent a body and an input section such as a keyboard, respectively.

In each example of the electronic apparatuses, each pixel in the liquid crystal has a protective structure for draining excessive carriers in the channel of the transistor; hence a display is resulted using a high-performance, high-withstand voltage active matrix liquid crystal panel.

Modifications of the Present Invention

Electro-optical apparatuses in this embodiment are not limited to those described above and can be modified into various types within the scope of the present invention.

For example, the switching transistor in the pixel may be replaced with complementary thin film transistors. Each embodiment described above enables drainage of excessive carriers from the channel region of each transistor.

Although a thin film transistor using the single-crystal silicon layer as a source, a drain and a channel has been described, the present invention is also applicable when a thin film transistor using a polycrystalline silicon layer or an amorphous silicon layer as a source, a drain and a channel has a problem of excessive carriers in the channel. Thus, the semiconductor layer is not limited to the single-crystal silicon.

Although the embodiments are described regarding liquid crystal panels, the present invention is applicable to devices other than liquid crystal panels. For example, the present invention is applicable to transistors for switching each pixel of spontaneous luminescent devices, such as electroluminescent (EL) devices using luminescent polymers, plasma displays (PDOP), and field emission devices (FED). Also, the present invention is applicable to transistors in pixels of mirror devices such as micro mirror devices (DMD) for changing the angle of the mirror of each pixel.

Accordingly, the substrate for electro-optical apparatuses in accordance with the present invention can suppress the substrate floating effect by draining excessive carriers, which accumulate in the semiconductor layer functioning as the channel region of the transistor connected to a pixel electrode, through a scanning signal line. Thus, deterioration of withstand voltage of the transistor due to the excessive carriers is suppressed and the reliability is improved. In conclusion, the use of the substrate for electro-optical apparatuses in accordance with the present invention enables production of devices having superior transistor characteristics.

What is claimed is:

1. A method for driving an electro-optical apparatus having a transistor provided to each pixel region of a matrix of pixel regions, a gate electrode of the transistor being connected to a first scanning signal line, the method comprising:

applying a selection potential to the scanning signal line to bring the transistor to a conductive state, applying an image signal to the pixel region through a channel region of the transistor, applying a non-selection potential to the scanning signal line to bring the transistor to a non-conductive state, and draining excessive charges from the channel region in the transistor.

2. The method for driving an electro-optical apparatus according to claim 1, charges in the channel region being drained through a second scanning signal line.

3. The method for driving an electro-optical apparatus according to claim 1, charges in the channel region being drained through a capacitor line.

* * * * *